(12) United States Patent
King

(10) Patent No.: US 7,186,619 B2
(45) Date of Patent: *Mar. 6, 2007

(54) INSULATED-GATE FIELD-EFFECT TRANSISTOR INTEGRATED WITH NEGATIVE DIFFERENTIAL RESISTANCE (NDR) FET

(75) Inventor: Tsu-Jae King, Fremont, CA (US)
n

(73) Assignee: Synopsys, Inc., Mountain View, CA (US)

( * ) Notice: Subject to any disclaimer, the term of this patent is extended or adjusted under 35 U.S.C. 154(b) by 352 days.

This patent is subject to a terminal disclaimer.

(21) Appl. No.: 10/867,006

(22) Filed: Jun. 14, 2004

(65) Prior Publication Data

US 2004/0238855 A1  Dec. 2, 2004

Related U.S. Application Data

(60) Division of application No. 10/028,084, filed on Dec. 21, 2001, now Pat. No. 6,754,104, which is a continuation-in-part of application No. 09/603,101, filed on Jun. 22, 2000, now Pat. No. 6,512,274, and a continuation-in-part of application No. 09/603,102, filed on Jun. 22, 2000, now Pat. No. 6,479,862, and a continuation-in-part of application No. 09/602,658, filed on Jun. 22, 2000, now Pat. No. 6,596,617.

(51) Int. Cl.
*H01L 21/8236* (2006.01)
(52) U.S. Cl. ............... 438/275; 438/276; 257/E21.532
(58) Field of Classification Search ........ 438/275–276, 438/279; 257/E21.532
See application file for complete search history.

(56) References Cited

U.S. PATENT DOCUMENTS

| 3,588,736 A | 6/1971 | McGroddy |
| 4,047,974 A | 9/1977 | Harari |
| 4,143,393 A | 3/1979 | DiMaria et al. |
| 4,806,998 A | 2/1989 | Vinter et al. |

(Continued)

FOREIGN PATENT DOCUMENTS

EP    1085656 A2    3/2001

(Continued)

OTHER PUBLICATIONS

Alejandro F. Gonzalez, et al., "Standard CMOS Implementation of a Multiple-Valued Logic Signed-Digit Adder Based on Negative Differential-Resistance Devices," Proceedings of the 30th IEEE International Symposium on Multiple-Valued Logic (ISMVL 2000), 6 pages.

(Continued)

*Primary Examiner*—Richard A. Booth
(74) *Attorney, Agent, or Firm*—Bever, Hoffman & Harms, LLP

(57) ABSTRACT

A semiconductor device is disclosed that includes integrated insulated-gate field-effect transistor (IGFET) elements and one or more negative differential resistance (NDR) field-effect transistor elements, combined and formed on a common substrate. Thus, a variety of circuits, including logic and memory are implemented with a combination of conventional and NDR capable FETs. Because both types of elements share a number of common features, they can be fabricated with common processing operations to achieve better integration in a manufacturing facility.

12 Claims, 22 Drawing Sheets

U.S. PATENT DOCUMENTS

| | | | |
|---|---|---|---|
| 4,945,393 | A | 7/1990 | Beltram et al. |
| 4,992,389 | A * | 2/1991 | Ogura et al. ............... 438/279 |
| 5,021,841 | A | 6/1991 | Leburton et al. |
| 5,032,891 | A | 7/1991 | Takagi et al. |
| 5,093,699 | A | 3/1992 | Weichold et al. |
| 5,130,763 | A | 7/1992 | Delhaye et al. |
| 5,162,880 | A | 11/1992 | Hazama et al. |
| 5,189,499 | A | 2/1993 | Izumi et al. |
| 5,357,134 | A | 10/1994 | Shimoji |
| 5,390,145 | A | 2/1995 | Nakasha et al. |
| 5,477,169 | A | 12/1995 | Shen et al. |
| 5,543,652 | A | 8/1996 | Ikeda et al. |
| 5,606,177 | A | 2/1997 | Wallace et al. |
| 5,633,178 | A | 5/1997 | Kalnitsky |
| 5,689,458 | A | 11/1997 | Kuriyama |
| 5,698,997 | A | 12/1997 | Williamson, III et al. |
| 5,705,827 | A | 1/1998 | Baba et al. |
| 5,770,958 | A | 6/1998 | Arai et al. |
| 5,773,996 | A | 6/1998 | Takao |
| 5,804,475 | A | 9/1998 | Meyer et al. |
| 5,869,845 | A | 2/1999 | Van der Wagt et al. |
| 5,883,549 | A | 3/1999 | De Los Santos |
| 5,883,829 | A | 3/1999 | Van der Wagt |
| 5,895,934 | A | 4/1999 | Harvey et al. |
| 5,903,170 | A | 5/1999 | Kulkarni et al. |
| 5,907,159 | A | 5/1999 | Roh et al. |
| 5,936,265 | A | 8/1999 | Koga |
| 5,953,249 | A | 9/1999 | Van der Wagt |
| 5,959,328 | A | 9/1999 | Krautschneider et al. |
| 5,962,864 | A | 10/1999 | Leadbeater et al. |
| 6,015,978 | A | 1/2000 | Yuki et al. |
| 6,077,760 | A | 6/2000 | Fang et al. |
| 6,091,077 | A | 7/2000 | Morita et al. |
| 6,104,631 | A | 8/2000 | El-Sharawy et al. |
| 6,246,606 | B1 | 6/2001 | Forbes et al. |
| 6,294,412 | B1 | 9/2001 | Krivokapic |
| 6,301,147 | B1 | 10/2001 | El-Sharawy et al. |
| 6,303,942 | B1 | 10/2001 | Farmer |
| 6,410,371 | B1 * | 6/2002 | Yu et al. ............... 438/151 |
| 6,528,356 | B2 | 3/2003 | Nemati et al. |
| 6,680,245 | B1 * | 1/2004 | King et al. ............... 438/606 |
| 2001/0005327 | A1 | 6/2001 | Duane et al. |
| 2001/0019137 | A1 | 9/2001 | Koga et al. |
| 2002/0096689 | A1 * | 7/2002 | Nemati et al. ............... 257/107 |

FOREIGN PATENT DOCUMENTS

| | | |
|---|---|---|
| EP | 1107317 A1 | 6/2001 |
| EP | 0526897 B1 | 11/2001 |
| WO | WO 9963598 | 4/1999 |
| WO | WO 0041309 | 7/2000 |

OTHER PUBLICATIONS

Seabaugh A., Brar B., Broekaert T., Morris F., and Frazier G., "Resonant Tunneling Mixed Signal Circuit Technology," Solid-State Electronics 43:1355-1365, 1999.

G. Wirth, et al., "Negative Differential Resistance in Ultrashort Bulk MOSFETs," IECON'99 Conference Proceedings, vol. 1, San Jose, 1999, S. 29-34.

R. H. Mathews, et al., "A New RTD-FET Logic Family," Proceedings of the IEEE, vol. 87, No. 4, pp. 596-605, 1999.

J. P. A. Van Der Wagt, "Tunneling-Based SRAM," Proceedings of the IEEE, vol. 87, No. 4, pp. 571-595, 1999.

C. P. Heij, et al., "Negative Differential Resistance Due to Single-Electron Switching," Applied Physics Letters, vol. 74, No. 7, Feb. 15, 1999, 5 pages.

C. Pacha, et al., "Resonant Tunneling Device Logic Circuits," Microelectronics Advanced Research Initiative (MEL-ARI,) Jul. 1998-Jul. 1999, pp. 1-22.

A. Seabaugh, "Promise of Tunnel Diode Integrated Circuits," Tunnel Diode and CMOS/HBT Integration Workshop, Dec. 9, 1999, Naval Research Laboratory, Washington, DC., 13 Pages.

Jian Fu Zhang, "Traps: Detrapping," Wiley Encyclopedia of Electrical and Electronics Engineering Online, Article Posting Date: Dec. 27, 1999, John Wiley & Sons, Inc., 4 Pages.

Jian Fu Zhang, "Traps: Effects of Traps and Trapped Charges on Device Performance," Wiley Encyclopedia of Electrical and Electronics Engineering Online, Article Posting Date: Dec. 27, 1999, John Wiley & Sons, Inc., 2 Pages.

Jian Fu Zhang, "Traps: Measurement Techniques," Wiley Encyclopedia of Electrical and Electronics Engineering Online, Article Posting Date: Dec. 27, 1999, John Wiley & Sons, Inc., 5 Pages.

Jian Fu Zhang, "Traps," Wiley Encyclopedia of Electrical and Electronics Engineering Online, Article Posting Date: Dec. 27, 1999, John Wiley & Sons, Inc., 2 Pages.

Jian Fu Zhang, "Traps: Trapping Kinetics," Wiley Encyclopedia of Electrical and Electronics Engineering Online, Article Posting Date: Dec. 27, 1999, John Wiley & Sons, Inc., 2 Pages.

Jian Fu Zhang, "Traps: Origin of Traps," Wiley Encyclopedia of Electrical and Electronics Engineering Online, Article Posting Date: Dec. 27, 1999, John Wiley & Sons, Inc., 4 pages.

Gardner, Carl, Ringhofer, Christian, "Smooth Quantum Hydrodynamic Model Simulation of the Resonant Tunneling Diode," Dept. Of Mathematics Arizona State University, pp. 1-5, (1998).

Jungel, A, Pohl, C., "Numerical Simulation of Semiconductor Devices: Energy-Transport and Quantum Hydrodynamic Modeling," Fachbereich Math., Tech. Univ. Berlin, Germany, pp. 1-9, 1998.

S.M.A. Nimour, R. Quasti, N. Zekri, "Effect of Spatially Disordered Barriers on the Band Structure of Finite Superlattices," phys. stat. sol. (b) 1998, 209, No. 2, 311-318.

S. L. Rommel, et al., "Room Temperature Operation of Epitaxially Grown Si/S10.5Ge0.5/Si Resonant Interband Tunneling Diodes," Applied Physics Letters, vol. 73, No. 15, pp. 2191-2193, 1998.

News Release from www.eurekalert.org/releases/udel-udcnflb.html, "UD Computer News: Future Looks Bright for Tunnel Diodes, Promising Faster, More Efficient Circuits," Oct. 1, 1998, 4 pages.

P. Mazumder, et al., "Digital Circuit Applications of Resonant Tunneling Devices," Proceedings of the IEEE, vol. 86, No. 4, pp. 664-686, Apr. 1998.

J. P. Sun, et al., "Resonant Tunneling Diodes: Models and Properties," Proceedings of the IEEE, vol. 86, No. 4, Apr. 1998, pp. 641-661.

J. P. A. Van Der Wagt, et al., "RTD/HFET Low Standby Power SRAM Gain Cell," Source: Corporate Research Laboratories, Texas Instruments, 1998, 4 pages.

C. Pacha and K. Goser, "Design of Arithmetic Circuits using Resonant Tunneling Diodes and Threshold Logic," Lehrstuhl Bauelemente der Elektrotechnik, Universitat Dortmund, pp. 1-11, Sep. 1997.

G. I. Haddad et al., "Tunneling Devices and Applications in High Functionality/Speed Digital Circuits," Solid State Electronics, vol. 41, No. 10, Oct. 1997, pp. 1515-1524.

S. J. Koester, et al., "Negative Differential Conductance in Lateral Double-Barrier Transistors Fabricated in Strained Si Quantum Wells," Applied Physics Letters, vol. 70, No. 18, May 1997, pp. 2422-2424.

Shao, Z., Porod, W., Lent, C., & Kirkner, D., "Transmission Zero Engineering in Lateral Double-Barrier Resonant Tunneling Devices," Dept. Of Electrical Engineering, University of Notre Dame, pp. 1-7 (1996).

E. Chan, et al., "Mask Programmable Multi-Valued Logic Gate Arrays Using RTDs and HBTs," IEE Proceedings-E: Computers and Digital Techniques, vol. 143, No. 5, Oct. 1996, pp. 289-294.

E. Chan, et al., "Compact Multiple-Valued Multiplexers Using Negative Differential Resistance Devices," IEEE Journal of Solid-State Circuits, vol. 31, No. 8, Aug. 1996, pp. 1151-1156.

S. Mohan, et al., "Ultrafast Pipelined Arithmetic Using Quantum Electronic Devices," IEE Proceedings-E: Computers and Digital Techniques, vol. 141, No. 2, Mar. 1994, pp. 104-110.

S. Luryi and M. Mastrapasqua, "Light-emitting Logic Devices based on Real Space Transfer in Complementary InGaAs/InAlAs Heterostructures", in "Negative Differential Resistance and Instabilities in 2D Semiconductors", ed. by N. Balkan, B. K. Ridley, and A. J. Vickers, NATO ASI Series [Physics]B 307, pp. 53-82, Plenum Press (New York 1993).

S. Mohan, et al., "Logic Design Based on Negative Differential Resistance Characteristics of Quantum Electronic Devices," IEE Proceedings-G: Electronic Devices, vol. 140, No. 6, Dec. 1993, pp. 383-391.

Serge Luryi and Mark Pinto, "Collector-Controlled States in Charge Injection Transistors," SPIE-92 Symposium, pp. 1-12, 1992.

Serge Luryi and Mark Pinto, "Collector-Controlled States and the Formation of Hot Electron Domains in Real-Space Transfer Transistors," AT&T Bell Laboratories, pp. 1-7, 1992.

S. Mohan, et al., "Ultrafast Pipelined Adders Using Resonant Tunneling Transistors," IEE Electronics Letters, vol. 27, No. 10, May 1991, pp. 830-831.

O. Le Neel, et al., "Electrical Transient Study of Negative Resistance in SOI MOS Transistors," Electronics Letters, vol. 26, No. 1, pp. 73-74, Jan. 1990.

P. S. Barlow, et al., "Negative differential output conductance of self-heated power MOSFETs," IEE Proceedings-I Solid-State and Electron Devices, vol. 133, Part I, No. 5, Oct. 1986, pp. 177-179.

Farid Nemati et al., "A Novel High Density, Low Voltage SRAM Cell With a Vertical NDR Device," Center for Integrated Systems, Stanford University, CA, (2 pages).

Farid Nemati et al., "A Novel Thyristor-based SRAM Cell (T-RAM) for High-Speed, Low-Voltage, Giga-scale Memories," Center for Integrated Systems, Stanford University, CA, (4 pages).

Shoucair F. et al., "Analysis and Stimulation of Simple Transistor Structures Exhibiting Negative Differential Resistance," EECS Department, UC Berkeley, Berkeley CA, (4 pages).

R. Oberhuber, et al., "Tunnel-Devices with Negative Differential Resistivity Based on Silicon?," Source: Deutsche Forschungsgemeinschaft and Siemens AG, date unknown, 2 pages.

* cited by examiner

INSULATED-GATE FIELD-EFFECT TRANSISTOR INTEGRATED WITH NEGATIVE DIFFERENTIAL RESISTANCE (NDR) FET

CROSS REFERENCE TO RELATED APPLICATIONS

The present application claims priority to and is a divisional of parent application Ser. No. 10/028,084 filed Dec. 21, 2001, now U.S. Pat. No. 6,754,104 and which parent application is a continuation-in-part and claims priority to each of the following applications, all of which were filed Jun. 22, 2000 and are hereby incorporated by reference as if fully set forth herein:

Ser. No. 09/603,101 entitled "A CMOS-PROCESS COMPATIBLE, TUNABLE NDR (NEGATIVE DIFFERENTIAL RESISTANCE) DEVICE AND METHOD OF OPERATING SAME"; now U.S. Pat. No. 6,512,274; and Ser. No. 09/603,102 entitled "CHARGE TRAPPING DEVICE AND METHOD FOR IMPLEMENTING A TRANSISTOR HAVING A NEGATIVE DIFFERENTIAL RESISTANCE MODE"; now U.S. Pat. No. 6,479,862; and Ser. No. 09/602,658 entitled "CMOS COMPATIBLE PROCESS FOR MAKING A TUNABLE NEGATIVE DIFFERENTIAL RESISTANCE (NDR) DEVICE" now U.S. Pat. No. 6,596,617

The present application is also related to the following applications, all of which were filed simultaneously with the above parent application and which are hereby incorporated by reference as if fully set forth herein:

An application Ser. No. 10/029,077 entitled "MEMORY CELL UTILIZING NEGATIVE DIFFERENTIAL RESISTANCE FIELD-EFFECT TRANSISTORS"; now U.S. Pat. No. 6,724,655;

An application Ser. No. 10/028,394 entitled "DUAL MODE FET & LOGIC CIRCUIT HAVING NEGATIVE DIFFERENTIAL RESISTANCE MODE"; now U.S. Pat. No. 6,518,589;

An application Ser. No. 10/028,089 entitled "CHARGE PUMP FOR NEGATIVE DIFFERENTIAL RESISTANCE TRANSISTOR" now U.S. Pat. No. 6,594,193;

An application Ser. no. 10/028,085 entitled "IMPROVED NEGATIVE DIFFERENTIAL RESISTANCE FIELD EFFECT TRANSISTOR (NDR-FET) & CIRCUITS USING THE SAME"; now U.S. Pat. No. 6,559,470.

FIELD OF THE INVENTION

This invention provides a semiconductor device, having a variety of applications such as a bistable latch or a logic circuit, in which one or more insulated-gate field-effect transistor (IGFET) elements and one or more negative differential resistance (NDR) field-effect transistor elements are combined and formed on a common substrate. The present invention is applicable to a wide range of semiconductor integrated circuits, particularly for high-density memory and logic applications.

BACKGROUND OF THE INVENTION

Devices that exhibit a negative differential resistance (NDR) characteristic, such that two stable voltage states exist for a given current level have long been sought after in the history of semiconductor devices. A new type of CMOS compatible, NDR capable FET is described in the afore-mentioned applications to King et al. referenced above. The advantages of such device are well set out in such materials, and are not repeated here.

NDR devices and their applications are further discussed in a number of references, including the following that are hereby incorporated by reference and identified by bracketed numbers [ ] where appropriate below:

[1] P. Mazumder, S. Kulkarni, M. Bhattacharya, J. P. Sun and G. I. Haddad, "Digital Circuit Applications of Resonant Tunneling Devices," Proceedings of the IEEE, Vol. 86, No. 4, pp. 664–686,1998.

[2] W. Takao, U.S. Pat. No. 5,773,996, "Multiple-valued logic circuit" (issued Jun. 30, 1998)

[3] Y. Nakasha and Y. Watanabe, U.S. Pat. No. 5,390,145, "Resonance tunnel diode memory" (issued Feb. 14, 1995)

[4] J. P. A. Van Der Wagt, "Tunneling-Based SRAM," Proceedings of the IEEE, Vol. 87, No. 4, pp. 571–595, 1999.

[5] R. H. Mathews, J. P. Sage, T. C. L. G. Sollner, S. D. Calawa, C.-L. Chen, L. J. Mahoney, P. A. Maki and K. M Molvar, "A New RTD-FET Logic Family," Proceedings of the IEEE, Vol. 87, No. 4, pp. 596–605, 1999.

[6] H. J. De Los Santos, U.S. Pat. No. 5,883,549, "Bipolar junction transistor (BJT)-resonant tunneling diode (RTD) oscillator circuit and method (issued Mar. 16, 1999)

[7] S. L. Rommel, T. E. Dillon, M. W. Dashiell, H. Feng, J. Kolodzey, P. R. Berger, P. E. Thompson, K. D. Hobart, R. Lake, A. C. Seabaugh, G. I(limeck and D. K. Blanks, "Room temperature operation of epitaxially grown $Si/Si_{0.5}Ge_{0.5}/Si$ resonant interband tunneling diodes," Applied Physics Letters, Vol. 73, No. 15, pp. 2191–2193, 1998.

[8] S. J. Koester, K. Ismail, K. Y. Lee and J. O. Chu, "Negative differential conductance in lateral double-barrier transistors fabricated in strained Si quantum wells," Applied Physics Letters, Vol. 70, No. 18, pp. 2422–2424, 1997.

[9] G. I. Haddad, U. K. Reddy, J. P. Sun and R. K. Mains, "The bound-state resonant tunneling transistor (BSRTf): Fabrication, d.c. I–V characteristics, and high-frequency properties," Superlattices and Microstructures, Vol. 7, No. 4, p. 369, 1990.

[10] Kulkanni et. al., U.S. Pat. No. 5,903,170, "Digital Logic Design Using Negative Differential Resistance Diodes and Field-Effect Transistors (issued May 11, 1999).

A wide range of circuit applications for NDR devices are proposed in the above references, including multiple-valued logic circuits [1,2], static memory (SRMM) cells [3,4], latches [5], and oscillators [6]. To date, technological obstacles have hindered the widespread use of NDR devices in conventional silicon-based integrated circuits (ICs). The most significant obstacle to large-scale commercialization has been the technological challenge of integrating high-performance NDR devices into a conventional IC fabrication process. The majority of NDR-based circuits require the use of transistors, so the monolithic integration of NDR devices with predominant complementary metal-oxide-semiconductor (CMOS) transistors is the ultimate goal for boosting circuit functionality and/or speed. Clearly, the development of a CMOS-compatible NDR device technology would constitute a break-through advancement in silicon-based IC technology. The integration of NDR devices with CMOS devices would provide a number of benefits including at least the following for logic and memory circuits:

1) reduced circuit complexity for implementing a given function;
2) lower-power operation; and
3) higher-speed operation.

Significant manufacturing cost savings could be achieved concomitantly, because more chips could be fabricated on a single silicon wafer without a significant increase in wafer-processing cost.

A tremendous amount of effort has been expended over the past several decades to research and develop silicon-based NDR devices in order to achieve compatibility with mainstream CMOS technology, because of the promise such devices hold for increasing IC performance and functionality. Efforts thus far have yielded NDR devices that require either prohibitively expensive process technology or extremely low operating temperatures which are impractical for high-volume applications. One such example in the prior art requires deposition of alternating layers of silicon and silicon-germanium alloy materials using molecular beam epitaxy (MBE) to achieve monolayer precision to fabricate the NDR device [7]. MBE is an expensive process which cannot be practically employed for high-volume production of semiconductor devices. Another example in the prior art requires the operation of a device at extremely low temperatures (1.4K) in order to achieve significant NDR characteristics [8]. This is impractical to implement for high-volume consumer electronics applications.

Three (or more) terminal devices are preferred as switching devices, because they allow for the conductivity between two terminals to be controlled by a voltage or current applied to a third terminal, an attractive feature for circuit design as it allows an extra degree of freedom and control in circuit designs. Three-terminal quantum devices which exhibit NDR characteristics such as the resonant tunneling transistor (RTT) [9] have been demonstrated; the performance of these devices has also been limited due to difficulties in fabrication, however. Some bipolar devices (such as SCRs) also can exhibit an NDR effect, but this is limited to embodiments where the effect is achieved with two different current levels. In other words, the current-vs.-voltage (I–V) curve of this type of device is not as useful because it does not provide two stable voltage states for a given current.

Accordingly, there exists a significant need for the monolithic integration of three-terminal NDR devices with conventional field-effect transistors by means of a single fabrication process flow.

SUMMARY OF THE INVENTION

A first object of the present invention is to provide a semiconductor device having a variety of applications such as bistable latch or logic circuits through the combination of one or more insulated-gate field-effect transistor (GFET) elements and one or mote negative differential resistance field-effect transistor NDR-FEI) elements.

A second object of the present invention is to provide a practical method of manufacturing a semiconductor device utilizing a single fabrication process flow, so that an IGFET and an NDR-FET can be formed on a common substrate.

For achieving the first object, the invention provides a semiconductor device comprising an IGFET including a gate and source/drain electrodes, and an NDR-FET including gate and source/drain electrodes, wherein the IGFET and NDR-FET elements are formed on a common substrate, and one of the gate or source/drain electrodes of the IGFET element is electrically connected with one of the source/drain electrodes of the NDR-FET. Thusly, various types of circuits having a variety of functions can be attained through the combination of an IGFET and an NDR-FET.

In one aspect of this invention, the NDR-FET can utilize silicon as the semiconductor material. Thus, the NDR-FET and the IGFET can be fabricated on a common silicon substrate and hence a semiconductor device incorporating one or more NDR elements and one or more conventional field-effect transistor elements can be practically realized.

In another aspect of this invention, the IGFET can be an n-channel enhancement-mode transistor, with the gate electrode and the drain electrode of the IGFET semiconductor element short-circuited and connected to a power-supply terminal, the source electrode of the IGFET electrically connected together with the drain electrode of the NDR-FET to a control terminal, the source of the NDR-FET connected to a grounded or negatively biased terminal, and the gate electrode of the NDR-FET biased at a constant voltage. Thus, among plural intersections between the current-vs.-voltage (I–V) characteristic of the NDR-FET and the I–V characteristic of the IGFET semiconductor element, an intersection at which the gradients (obtained as a change in current in accordance with a change of the control terminal voltage) of the characteristics have different signs (positive, negative, or zero) is a stable operating point of the semiconductor device. Therefore, the semiconductor device can function as a bistable memory cell.

In another aspect of this invention, the IGFET can be an n-channel enhancement-mode transistor, with the source electrode connected to a grounded or negatively-biased terminal, the gate electrode and the drain electrode of the IGFET semiconductor element short-circuited and electrically connected together with the source of the NDR-FET to a control terminal, the drain electrode of the NDR-FET connected to a power-supply terminal, and the gate electrode of the NDR-FET biased at a constant voltage. Thus, among plural intersections between the I–V characteristic of the NDR-FET and the I–V characteristic of the IGFET semiconductor element, an intersection at which the gradients (obtained as a change in current in accordance with a change of the control terminal voltage) of the characteristics have different signs (positive, negative, or zero) is a stable operating point of the semiconductor device. Therefore, the semiconductor device can function as a bistable memory cell.

In another aspect of this invention, the IGFET can be an n-channel depletion-mode transistor, with the gate electrode and the source electrode of the IGFET semiconductor element short-circuited and the drain electrode connected to a power-supply terminal, the source electrode of the IGFET electrically connected together with the drain electrode of the NDR-FET to a control terminal, the source of the NDR-FET connected to a grounded or negatively biased terminal, and the gate electrode of the NDR-FET biased at a constant voltage. Thus, among plural intersections between the I–V characteristic of the NDR-FET and the I–V characteristic of the IGFET semiconductor element, an intersection at which the gradients (obtained as a change in current in accordance with a change of the control terminal voltage) of the characteristics have different signs (positive, negative, or zero) is a stable operating point of the semiconductor device. Therefore, the semiconductor device can function as a bistable memory cell.

In another aspect of this invention, the IGFET can be an n-channel depletion-mode transistor, with the gate electrode and the source electrode of the IGFET semiconductor element short-circuited and connected to a grounded or negatively-biased terminal, the drain electrode of the IGFET electrically connected together with the source of the NDR-FET to a control terminal, the drain electrode of the NDR-FET connected to a power-supply terminal, and the gate electrode of the NDR-FET biased at a constant voltage.

Thus, among plural intersections between the I–V characteristic of the NDR-FET and the I–V characteristic of the IGFET semiconductor element, an intersection at which the gradients (obtained as a change in current in accordance with a change of the control terminal voltage) of the characteristics have different signs (positive, negative, or zero) is a stable operating point of the semiconductor device. Therefore, the semiconductor device can function as a bistable memory cell.

In another aspect of this invention, the IGFET can be an n-channel enhancement-mode transistor, with one of the source/drain electrodes of the IGFET semiconductor element connected to the source electrode of a first NDR-FET and also to the drain electrode of a second NDR-FET, the gate electrode of the IGFET connected to a first control terminal, the other one of the source/drain electrodes of the IGFET connected to a second control terminal, the drain electrode of the first NDR-FET connected to a power-supply terminal, the source electrode of the second NDR-FET connected to a grounded or negatively-biased terminal, and the gate electrodes of the NDR-FETs each biased at a constant voltage. Thus, among plural intersections between the I–V characteristic of the first NDR-FET and the I–V characteristic of the second NDR-FET, an intersection at which the gradients (obtained as a change in current in accordance with a change of the control terminal voltage) of the characteristics have different signs (positive, negative, or zero) is a stable operating point of the semiconductor device. Therefore, the semiconductor device can function as a bistable memory cell, with access to the data storage node provided via the IGFET.

For achieving the second object, the invention provides a method of manufacturing a semiconductor device including an IGFET semiconductor element having a gate electrode, a gate insulating film and a channel region and source/drain regions of semiconductor, and a NDR-FET having a gate electrode, a gate insulating film and a channel region and source/drain regions of semiconductor, wherein the IGFET and NDR-FET elements are formed on a common substrate, and at least one of the gate or source/drain electrodes of the IGFET element is electrically connected to one of the source/drain electrodes of the NDR-FET.

The method comprises the following steps: simultaneously forming electrically isolated "active" regions for the IGFET and NDR-FET elements in the surface of a semiconductor substrate; sequentially and separately adjusting the NDR-FET and IGFET channel dopant concentrations in the surface regions of the semiconductor substrate; forming the gate insulating films for the NDR-FET and IGFET elements by thermal oxidation and/or thin-film deposition; selectively forming charge traps in the gate insulating film or at the interface between the gate insulating film and the semiconductor channel of the NDR-FET element either by ion implantation and/or diffusion of an appropriate species or by depositing a charge-trapping layer either before or after part or all of the NDR-FET gate insulating film has been formed; forming contact holes in the source or drain region of the IGFET if needed; blanket depositing a gate-electrode material on the gate insulating films of the IGFET and the NDR-FET elements; simultaneously completing the fabrication of the IGFET and NDR-FET elements using conventional IC fabrication process steps to pattern the gate electrodes, dope the gate electrodes and form the source and drain electrodes, deposit passivation layer(s), and form interconnects.

In one aspect, the IGFET and NDR-FET may be fabricated side-by-side in the same active region, or "well."

In another aspect, the semiconductor substrate is monocrystalline silicon.

In another aspect, the semiconductor substrate is a silicon-on-insulator (monocrystalline silicon layer on top of an electrically insulating $SiO_2$ layer on top of a silicon wafer) substrate.

In another aspect, the channel dopant concentration in the NDR-FET may be substantially different from the channel dopant concentration in the IGFET.

In another aspect, a portion or all of the gate insulating film for the NDR-FET may be formed before the gate insulating film for the IGFET is formed.

In another aspect, the semiconductor substrate may contain one or more layers of silicon-germanium in either or both of the IGFET and NDR-FET active regions.

In another aspect, the thickness of the gate insulating film in the NDR-FET may be substantially different from the thickness of the gate insulating film in the IGFET.

In another aspect, formation of charge traps in the gate insulating film of the NDR-FET is facilitated by incorporating boron, which may be achieved by thermal oxidation of a boron-doped channel and/or thermal diffusion of boron from the channel into the gate insulating film.

In another aspect, charge traps are formed in the gate insulating film of the NDR-FET by depositing a layer of material, such as silicon or silicon-rich oxide, after a portion of the gate insulating film has been formed, and before the remaining portion of the gate insulating film is formed. The deposited layer may be continuous, in the form of a thin film, or it may be discontinuous, in the form of islands.

In another aspect, charge traps are formed in the gate insulating film of the NDR-FET by depositing a layer of material which contains a high density of charge traps, such as silicon-rich oxide, silicon oxynitride, silicon nitride, or high-permittivity dielectric, before the remaining portion of the gate insulating film is formed.

In another aspect, charge traps are formed in the gate insulating film of the NDR-FET by implantation of arsenic, phosphorus, fluorine, silicon, germanium, nitrogen, or metallic atoms.

In another aspect, a polycrystalline silicon (poly-Si) or polycrystalline silicon-germanium (poly-SiGe) film can be deposited as the gate-electrode material.

In another aspect, a metal or conductive metal-nitride or conductive metal-oxide or metal-silicide film can be deposited as the gate-electrode material.

In this manner, a semiconductor device comprising one or more IGFET elements and one or more NDR-FET elements can be manufactured on a common substrate utilizing a fabrication sequence consisting of conventional process steps. Accordingly, the manufacture of the semiconductor device can be eased and the manufacturing cost can be relatively low.

DETAILED DESCRIPTION OF THE INVENTION

Figure 1:
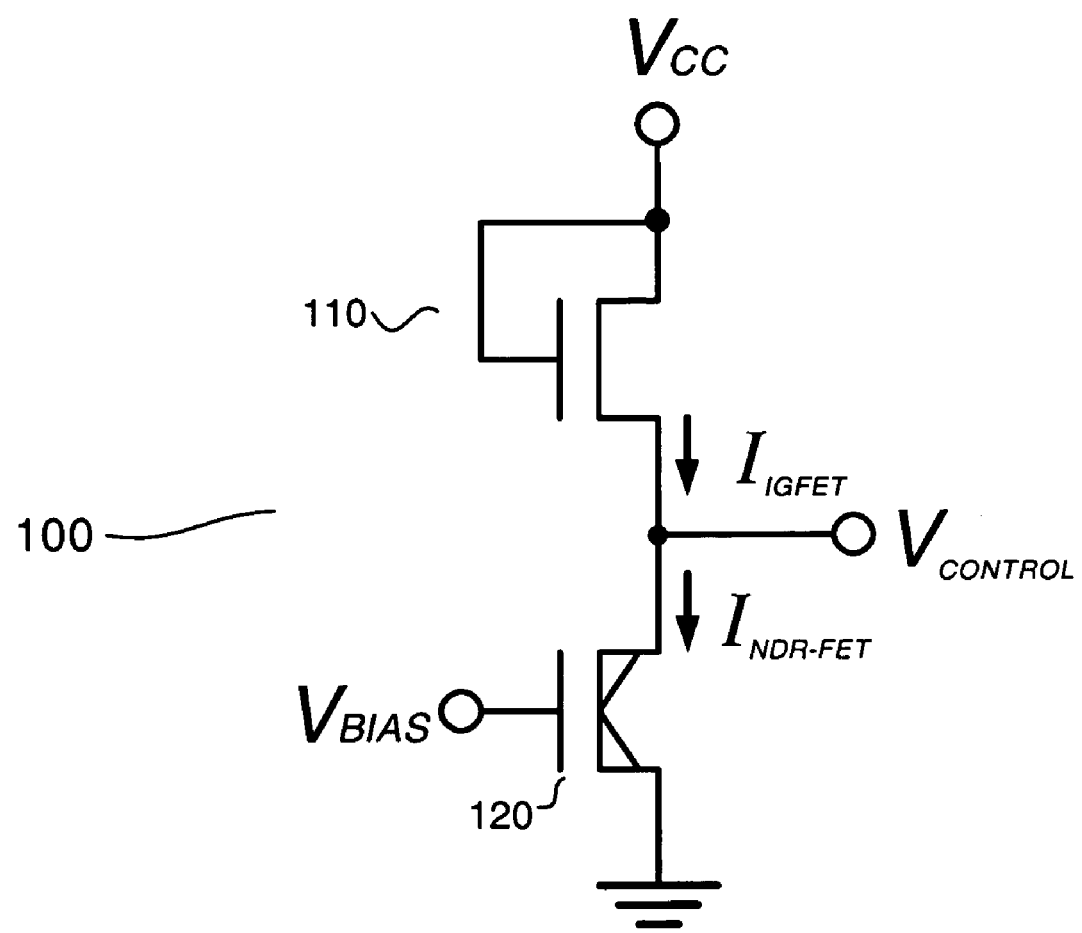
FIG. 1 is a circuit diagram of a bistable memory cell consisting of the combination of one enhancement-mode IGFET pull-up element and one NDR-FET pull-down element.
Figure 2:
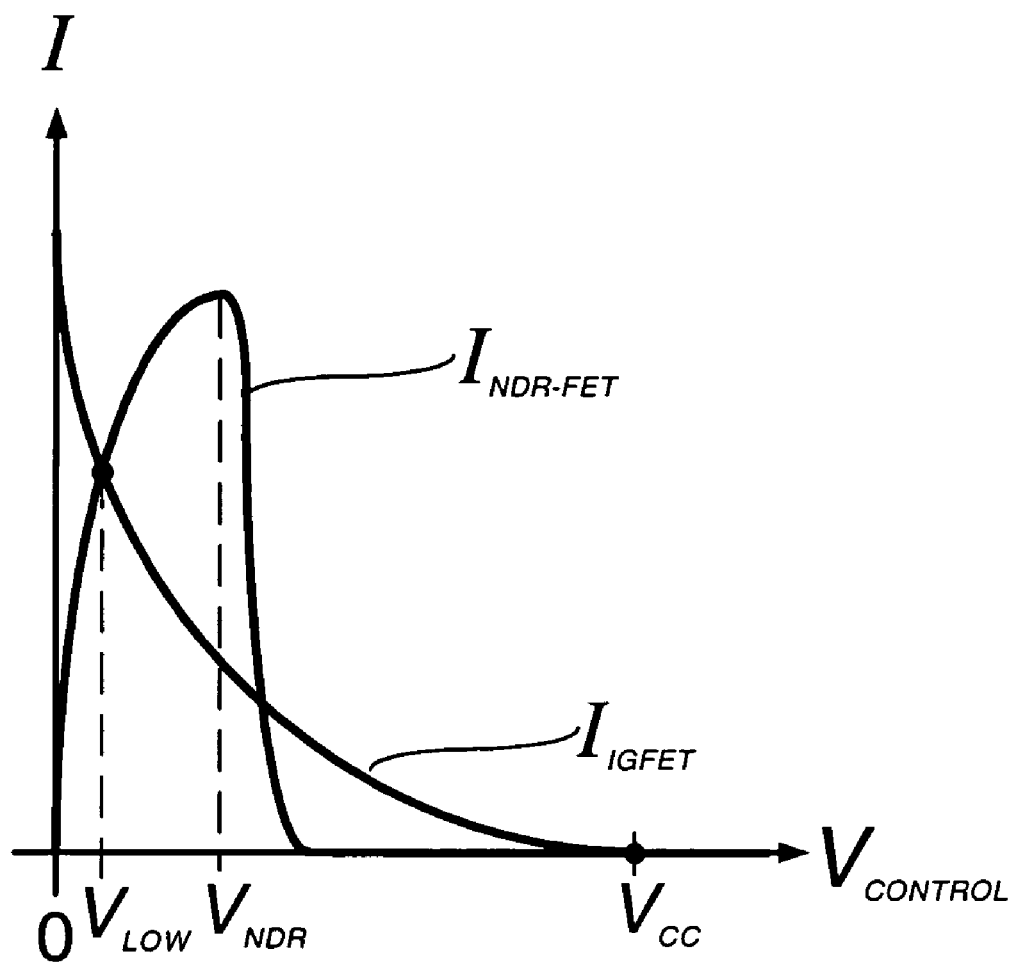
FIG. 2 is a plot of the current-vs.-voltage characteristic of the bistable memory cell of FIG. 1.

A semiconductor device according to a first embodiment of the invention will now be described with reference to FIGS. 1 and 2. FIG. 1 is a circuit diagram of a bistable memory cell 100 consisting of one enhancement-mode IGFET "pull-up" element 110 and one NDR-FET "pull-down" element 120, and FIG. 2 is a current-vs.-voltage plot illustrating the operational characteristics of the bistable memory cell of FIG. 1.

As is shown in FIG. 1, a positive voltage $V_{cc}$ is supplied to a drain electrode and gate electrode of IGFET 110, and a source electrode of IGFET 110 is connected together with a drain electrode of NDR-FET 120 to a common control terminal at potential $V_{control}$, and a source electrode of NDR-FET 120 is connected to a ground terminal. With its drain electrode and gate electrode biased at the same potential, IGFET 110 operates in a saturation mode. A current flowing in IGFET 110, $I_{IGFET}$, is directly dependent on a voltage difference between its drain electrode potential and its source electrode potential, $V_{cc}-V_{control}$, and increases as $V_{cc}-V_{control}$ increases, i.e. as $V_{control}$ decreases below $V_{cc}$. A positive voltage $V_{bias}$ is supplied to the gate electrode of NDR-FET 120, such that a current flowing in NDR-FET 120, $I_{NDR-FET}$, will exceed that of IGFET 110 over a range of values for $V_{control}$. $I_{NDR-FET}$ is dependent on a difference between its drain electrode potential and its source electrode potential, $V_{control}$, at first increasing rapidly as $V_{control}$ increases (i.e., operating as a conventional FET), reaching a peak value when $V_{control}$ is equal to a critical voltage $V_{NDR}$, and rapidly decreasing to nearly zero as $V_{control}$ increases beyond the critical voltage $V_{NDR}$ (i.e., operating as an NDR FET).

Now the operation of memory circuit 100 of FIG. 1 will be described. FIG. 2 shows a current-vs.-voltage (I–V) characteristic curve $I_{GFET}$ of IGFET 110 obtained by changing a control voltage $V_{control}$ applied to a control terminal in a range between 0 and $V_{cc}$, superimposed with the I–V characteristic curve $I_{NDR-FET}$ of NDR-FET 120. A stable operating point of circuit 100 occurs at a point where I–V characteristic curve $I_{IGFET}$ of IGFET 110 crosses an I–V characteristic curve $I_{NDRFET}$ of NDR-FET 120 and additionally the characteristic curves $I_{IGFET}$ and $I_{NDRFET}$ have different gradient signs (positive, negative, or zero). (A crossing point where both characteristic curves $I_{IGFET}$ and $I_{NDRFET}$ have positive or negative gradient is not a stable operating point.) Therefore it is understood that circuit 100 is stable when a potential $V_{control}$ at a control terminal is one of two values $V_{low}$ and $V_{cc}$ as shown in FIG. 2. Accordingly, circuit 100 can be used as a bistable memory cell by applying a potential of one of the two values $V_{low}$ and $V_{cc}$ to control terminal as a write voltage. If the value of $V_{control}$ falls slightly below that of a stable operating point, the IGFET current $I_{IGFET}$ becomes higher than the NDR-FET current $I_{NDR-FET}$, causing the value of $V_{control}$ to be increased toward $V_{cc}$, to restore it to that of the stable operating point. Thus IGFET 110 serves as a "pull-up" device. If the value of $V_{control}$ increases slightly above that of a stable operating point, the NDR-FET current $I_{NDR-FET}$ becomes higher than the IGFET current $I_{IGFET}$, causing the value of $V_{control}$ to be decreased toward 0 V (ground potential), to restore it to that of the stable operating point. Thus NDR-FET 120 serves as a "pull-down" device.

In this manner, a bistable memory cell can be obtained when an NDR-FET and an IGFET are formed on the same semiconductor substrate. Data can be written or read from such cell 100 in any conventional fashion known to those in the art.

NDR FET 120 and IGFET 110 can thus share a number of common structural features, including isolation regions, source/drain regions, gate insulating layers, gate electrode layers, contact layers, etc., and be manufactured according to a common set of processing operations. This latter feature ensures that the present invention is easily integrable into contemporary conventional wafer manufacturing facilities.

For the discusson below, except where otherwise noted, like numbered structures referenced in the text and in the drawings are intended to correspond to the same structures as previously discussed in connection with FIGS. 1 and 2.

Figure 3:
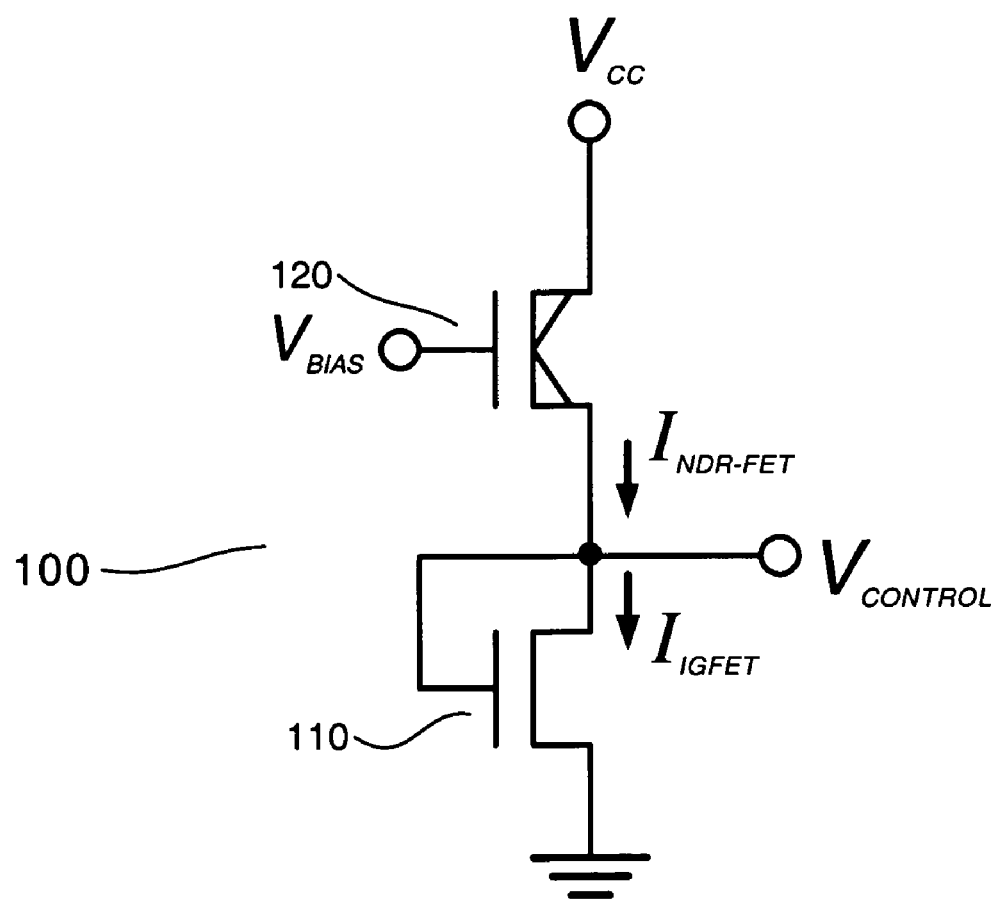
FIG. 3 is a circuit diagram of a bistable memory cell consisting of the combination of one NDR-FET pull-up element and one enhancement-mode IGFET pull-down element.
Figure 4:
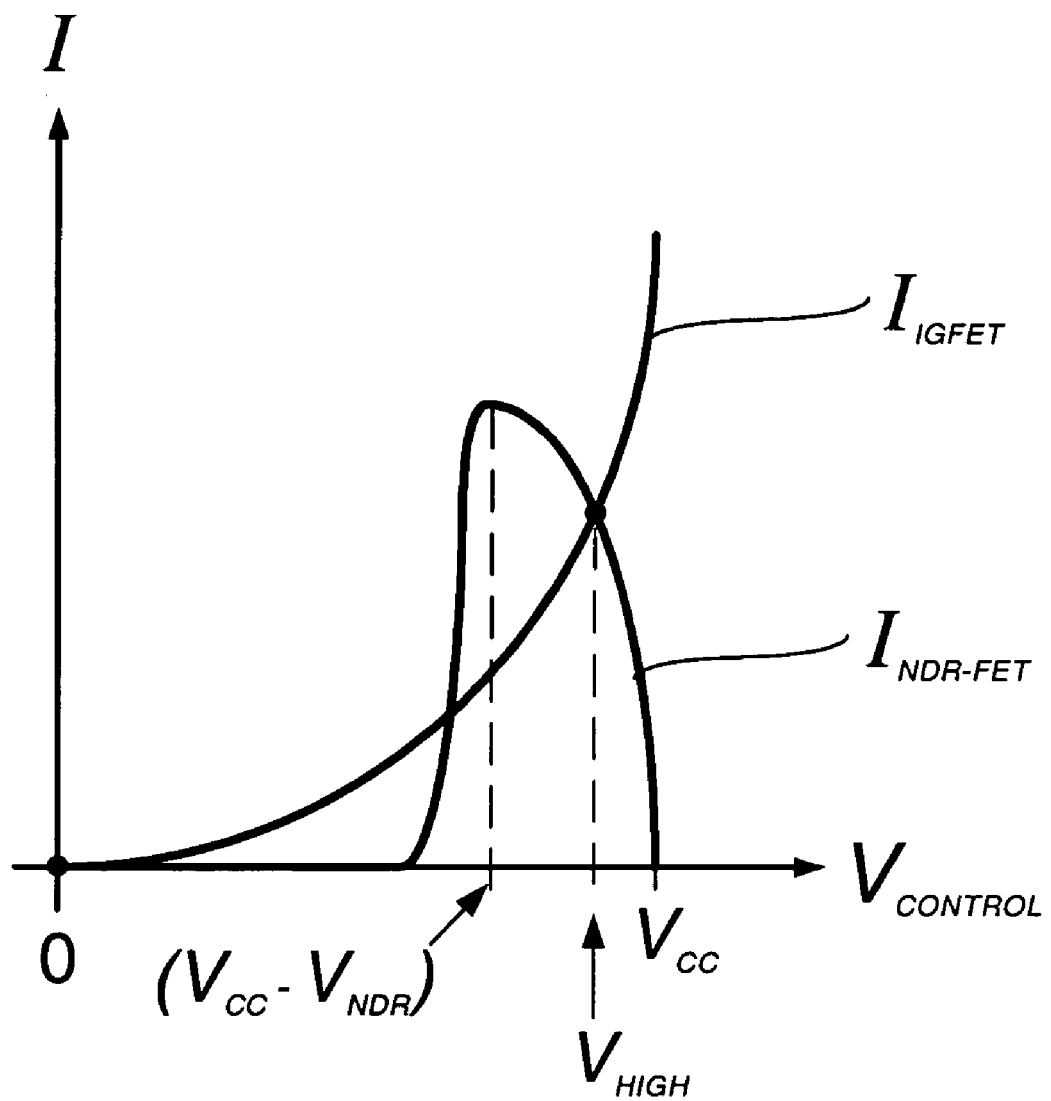
FIG. 4 is a plot of the current-vs.-voltage characteristic of the bistable memory cell of FIG. 3.

A semiconductor circuit according a second embodiment of the invention will now be described with reference to FIGS. 3 and 4. FIG. 3 is a circuit diagram of a bistable memory cell 100 consisting of one NDR-FET "pull-up" element 120 and one enhancement-mode IGFET "pull-down" element 110, and FIG. 4 is a current-vs.-voltage plot illustrating the operational characteristics of the bistable memory cell of FIG. 3.

As is shown in FIG. 3, a positive voltage $V_{cc}$ is supplied to the drain electrode of NDR-FET 120, the source electrode of NDR-FET 120 is connected together with the drain electrode of IGFET 110 and the gate electrode of IGFET 110 to a common control terminal at potential $V_{control}$, and the source electrode of IGFET 110 is connected to a ground terminal. With its drain electrode and gate electrode biased at the same potential, IGFET 110 again operates in the saturation mode. The current flowing in IGFET 110, $I_{IGFET}$, is directly dependent on the difference between its drain electrode potential and its source electrode potential, $V_{control}$, and increases as $V_{control}$ increases. A positive voltage $V_{bias}$ is supplied to the gate electrode of NDR-FET 120, such that the current flowing in the NDR-FET, $I_{NDR-FET}$, will exceed that of IGFET 110 over a range of values for $V_{control}$. $I_{NDR-FET}$ is dependent on the difference between its drain electrode potential and its source electrode potential, $V_{cc}-V_{control}$, at first increasing rapidly as $V_{cc}-V_{control}$ increases, reaching a peak value when $V_{cc}-V_{control}$ is equal to a critical voltage $V_{NDR}$, and rapidly decreasing to nearly zero as $V_{cc}-V_{control}$ increases beyond the critical voltage $V_{NDR}$.

Now the operation of circuit 100 of FIG. 3 will be described. FIG. 4 shows the current-vs.-voltage (I–V) characteristic curve $I_{IGFET}$ of IGFET 110 obtained by changing the control voltage $V_{control}$ applied to the control terminal in a range between 0 and $V_{cc}$, superimposed with the I–V characteristic curve $I_{NDR-FET}$ of the NDR-FET. As before, a stable operating point of the circuit is a point where the I–V characteristic curve $I_{IGFET}$ of IGFET 110 crosses the I–V characteristic curve $I_{NDRFET}$ of NDR-FET 120 and additionally the characteristic curves $I_{IGFET}$ and $I_{NDRFET}$ have different gradient signs (positive, negative, or zero). (A crossing point where both of the characteristic curves $I_{IGFET}$ and $I_{NDRFET}$ have positive or negative gradient is not a stable operating point.) Therefore it is understood that the circuit is stable when the potential $V_{control}$ at the control terminal is one of two values 0 and $V_{high}$ as shown in FIG. 4. Accordingly, circuit 100 also can be used as a bistable memory cell by applying a potential of one of the two values 0 and $V_{high}$ to the control terminal as a write voltage. If the value of $V_{control}$ falls slightly below that of a stable operating point, the NDR-FET current $I_{NDR-FET}$ becomes higher than the IGFET current $I_{IGFET}$, causing the value of $V_{control}$ to be increased toward $V_{cc}$, to restore it to that of the stable operating point. Thus in this embodiment NDR-FET 120 serves as a "pull-up" device. If the value of $V_{control}$ increases slightly above that of a stable operating point, IGFET current $I_{IGFET}$ becomes higher than the NDR-FET current $I_{NDR-FET}$, causing the value of $V_{control}$ to be decreased toward 0 V (ground potential), to restore it to that of the stable operating point. Thus IGFET 110 serves as a "pull-down" device in this embodiment. In this manner, a bistable memory cell can be obtained when an NDR-FET and an IGFET are formed on the same semiconductor substrate.

Figure 5:
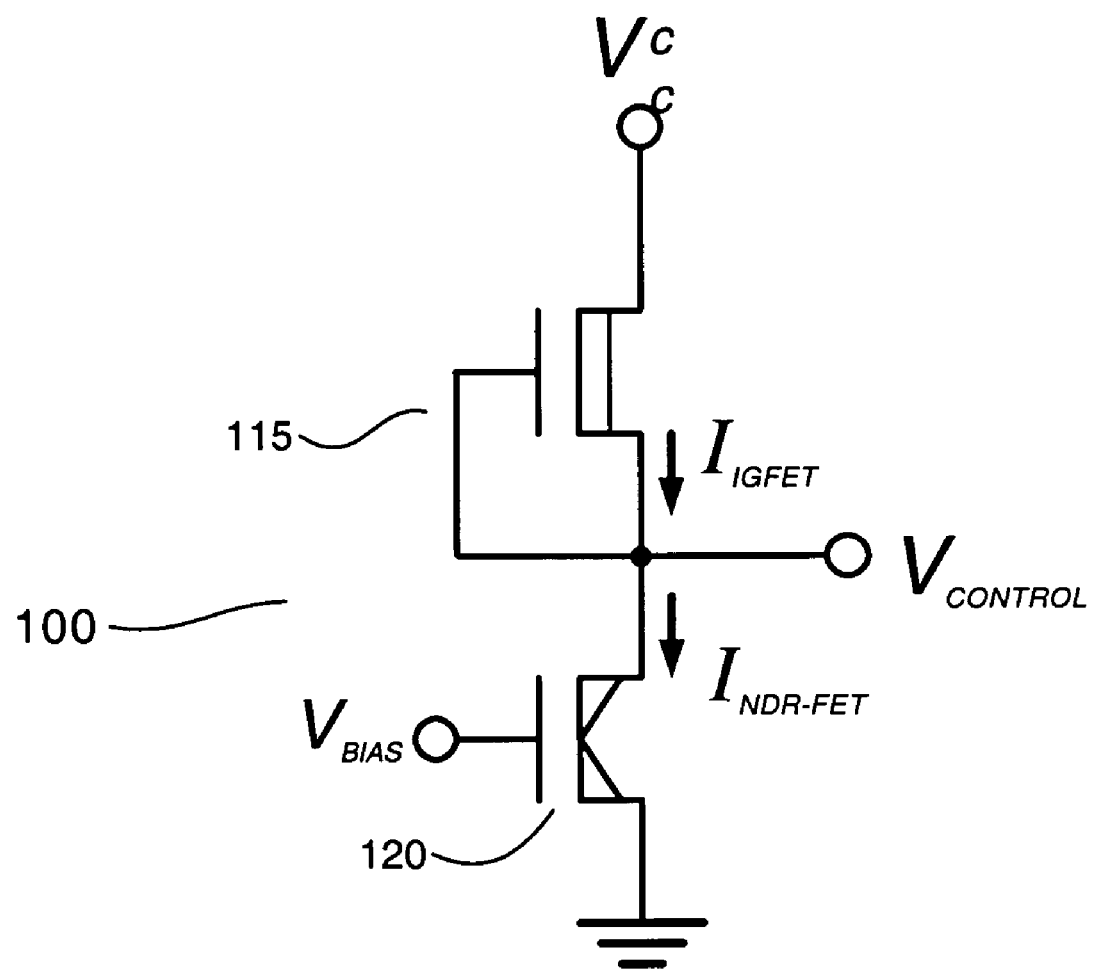
FIG. 5 is a circuit diagram of a bistable memory cell consisting of the combination of one depletion-mode IGFET pull-up element and one NDR-FET pull-down element.
Figure 6:
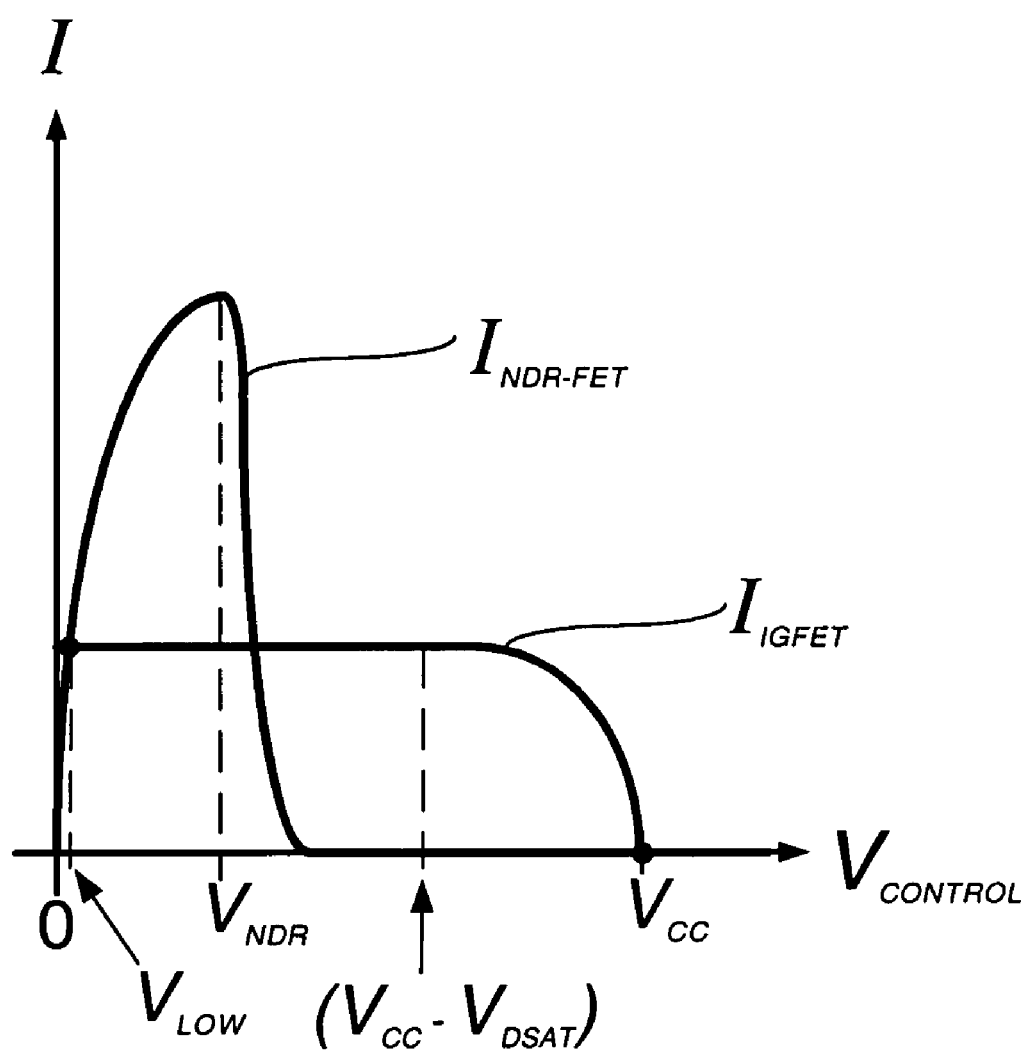
FIG. 6 is a plot of the current-vs.-voltage characteristic of the bistable memory cell of FIG. 5.

A semiconductor device according a third embodiment of the invention will now be described with reference to FIGS. 5 and 6. FIG. 5 is a circuit diagram of a bistable memory cell 100 consisting of one depletion-mode IGFET "pull-up" element 115 and one NDR-FET "pull-down" element 120, and FIG. 6 is a current-vs.-voltage plot illustrating the operational characteristics of the bistable memory cell of FIG. 5.

As is shown in FIG. 5, a positive voltage $V_{cc}$ is supplied to the drain electrode of IGFET 115, the gate electrode of IGFET 115 is connected together with the source electrode of IGFET 115 and the drain electrode of NDR-FET 120 to a common control terminal at potential $V_{control}$, and the source electrode of NDR-FET 120 is connected to a ground terminal. The current flowing in the IGFET, $I_{IGFET}$, is directly dependent on the difference between its drain electrode potential and its source electrode potential, $V_{cc}-V_{control}$) and increases as $V_{cc}-V_{control}$ increases, i.e. as $V_{control}$ decreases below $V_{cc}$. $I_{GFET}$ increases relatively slowly as $V_{cc}-V_{control}$ increases above a saturation voltage $V_{Dsat}$. A positive voltage $V_{bias}$ is supplied to the gate electrode of NDR-FET 120, such that the current flowing in the NDR-FET, $I_{NDR-FET}$, will exceed that of IGFET 115 over a range of values for $V_{control}$. $I_{NDR-FET}$ is dependent on the difference between its drain electrode potential and its source electrode potential, $V_{control}$, at first increasing rapidly as $V_{control}$ increases, reaching a peak value when $V_{control}$ is equal to a critical voltage $V_{NDR}$, and rapidly decreasing to nearly zero as $V_{control}$ increases beyond the critical voltage $V_{NDR}$.

Now the operation of the circuit of FIG. 5 will be described. FIG. 6 shows the current-vs.-voltage (I–V) characteristic curve $I_{IGFET}$ of IGFET 115 obtained by changing the control voltage $V_{control}$ applied to the control terminal in a range between 0 and $V_{cc}$, superimposed with the I–V characteristic curve $I_{NDR-FET}$ of NDR-FET 120. A stable operating point of circuit 100 is a point where the I–V characteristic curve $I_{IGFET}$ of the IGFET crosses the I–V characteristic curve $I_{NDRFET}$ of the NDR-FET and additionally the characteristic curves $I_{IGFET}$ and $I_{NDRFET}$ have different gradient signs (positive, negative, or zero). (A crossing point where both of the characteristic curves $I_{IGFET}$ and $I_{NDRFET}$ have positive or negative gradient is not a stable operating point.) Therefore it is understood that the circuit is stable when the potential $V_{control}$ at the control terminal is one of two values $V_{low}$ and $V_{cc}$ as shown in FIG. 6.

Accordingly, circuit 100 can be used as a bistable memory cell by applying a potential of one of the two values $V_{low}$ and $V_{cc}$ to the control terminal as a write voltage. If the value of $V_{control}$ falls slightly below that of a stable operating point, the IGFET current $I_{IGFET}$ becomes higher than the NDR-FET current $I_{NDR-FET}$, causing the value of $V_{control}$ to be increased toward $V_{cc}$, to restore it to that of the stable operating point. Thus IGFET 115 serves as a "pull-up" device. If the value of $V_{control}$ increases slightly above that of a stable operating point, the NDR-FET current $I_{NDR-FET}$ becomes higher than the IGFET current $I_{IGEFT}$, causing the value of $V_{control}$ to be decreased toward 0 V (ground potential), to restore it to that of the stable operating point. Thus NDR-FET 120 serves as a "pull-down" device. In this manner, a bistable memory cell can be obtained when an NDR-FET and an IGFET are formed on the same semiconductor substrate.

Figure 7:
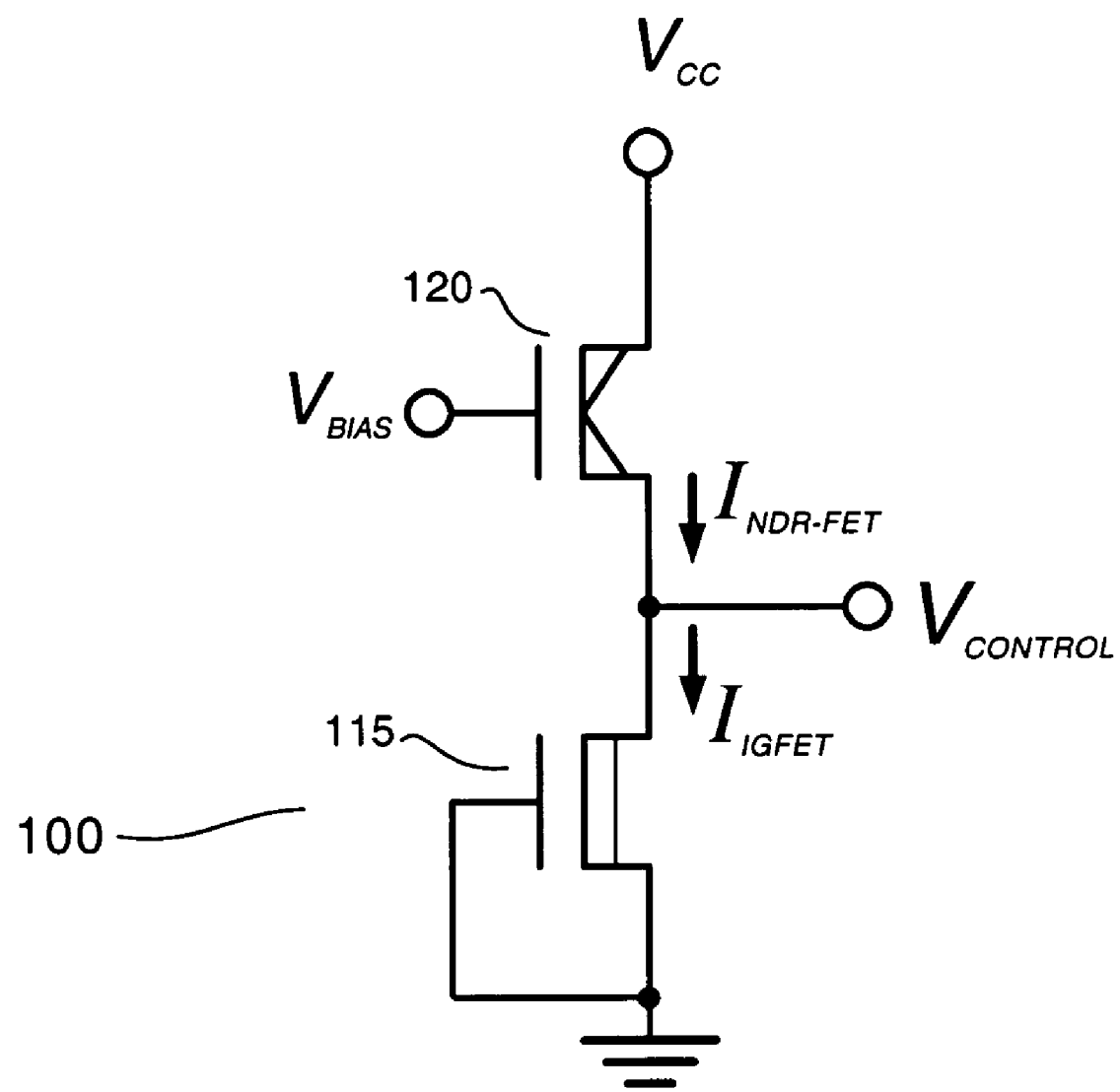
FIG. 7 is a circuit diagram of a bistable memory cell consisting of the combination of one NDR-FET pull-up element and one depletion-mode IGFET pull-down element.
Figure 8:
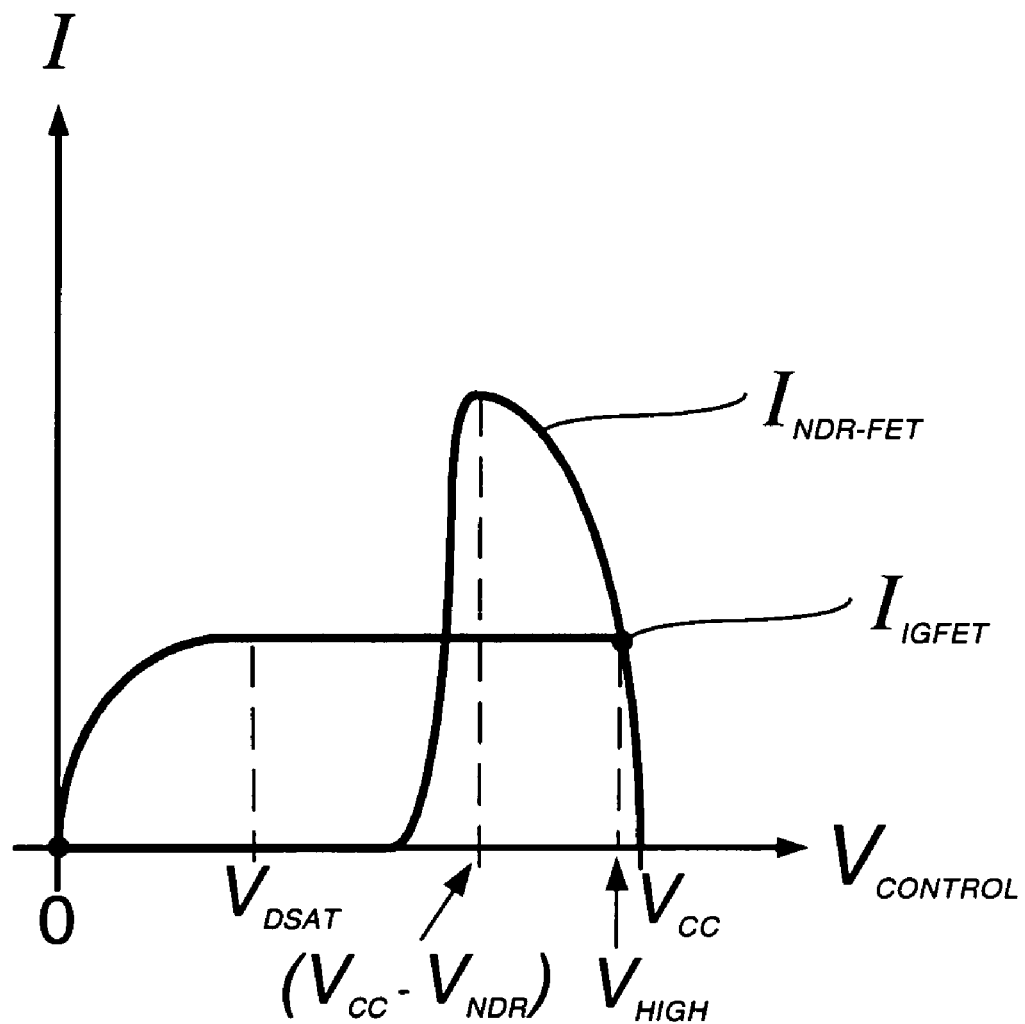
FIG. 8 is a plot of the current-vs.-voltage characteristic of the bistable memory cell of FIG. 7.

A semiconductor device according a fourth embodiment of the invention will now be described with reference to FIGS. 7 and 8. FIG. 7 is a circuit diagram of a bistable memory cell 100 consisting of one NDR-FET "pull-up" element 120 and one depletion-mode IGFET "pull-down" element 115, and FIG. 8 is a current-vs.-voltage plot illustrating the operational characteristics of the bistable memory cell 100 of FIG. 7.

As is shown in FIG. 7, a positive voltage $V_{cc}$ is supplied to the drain electrode of NDR-FET 120, the source electrode of NDR-FET 120 is connected together with the drain electrode of IGFET 115 to a common control terminal at potential $V_{control}$, and the gate electrode of IGFET 115 is connected together with the source electrode of IGFET 115 to a ground terminal. The current flowing in the IGFET, $I_{IGFET}$ is directly dependent on the difference between its drain electrode potential and its source electrode potential, $V_{control}$, and increases as $V_{control}$ increases. $I_{IGFET}$ increases relatively slowly as $V_{control}$ increases above a saturation voltage $V_{Dsat}$. A positive voltage $V_{bias}$ is supplied to the gate electrode of NDR-FET 120, such that the current flowing in the NDR-FET, $I_{NDR\text{-}FFT}$, will exceed that of IGFET 115 over a range of values for $V_{control}$. $I_{NDR\text{-}FET}$ is dependent on the difference between its drain electrode potential and its source electrode potential $V_{cc}\text{-}V_{control}$, at first increasing rapidly as $V_{cc}\text{-}V_{control}$ increases, reaching a peak value when $V_{cc}\text{-}V_{control}$ is equal to a critical voltage $V_{NDR}$, and rapidly decreasing to nearly zero as $V_{cc}\text{-}V_{control}$ increases beyond the critical voltage $V_{NDR}$.

Now the operation of the circuit of FIG. 7 will be described. FIG. 8 shows the current-vs.-voltage (I–V) characteristic curve $I_{IGFET}$ of IGFET 115 obtained by changing the control voltage $V_{control}$ applied to the control terminal in a range between 0 and $V_{cc}$, superimposed with the I–V characteristic curve $I_{NDR\text{-}FET}$ of the NDR-FET. A stable operating point of the circuit is a point where the I–V characteristic curve $I_{IGFET}$ of IGFET 115 crosses the I–V characteristic curve $I_{NDRFET}$ of NDR-FET 120 and additionally the characteristic curves $I_{IGFET}$ and $I_{NDRFET}$ have different gradient signs (positive, negative, or zero). (A crossing point where both of the characteristic curves $I_{IGFET}$ and $I_{NDRFET}$ have positive or negative gradient is not a stable operating point.) Therefore it is understood that circuit 100 is stable when the potential $V_{control}$ at the control terminal is one of two values 0 and $V_{high}$, as shown in FIG. 8. Accordingly, circuit 100 can be used as a bistable memory cell by applying a potential of one of the two values 0 and $V_{high}$ to the control terminal as a write voltage. If the value of $V_{control}$ falls slightly below that of a stable operating point, the NDR-FET current $I_{NDR\text{-}FET}$ becomes higher than the IGFET current $I_{IGFET}$, causing the value of $V_{control}$ to be increased toward $V_{cc}$, to restore it to that of the stable operating point. Thus NDR-FET 120 serves as a "pull-up" device. If the value of $V_{control}$ increases slightly above that of a stable operating point, the IGFET current $I_{IGFET}$ becomes higher than the NDR-FET current $I_{NDR\text{-}FET}$, causing the value of $V_{control}$ to be decreased toward 0 V (ground potential), to restore it to that of the stable operating point. Thus IGFET 115 serves as a "pul-down" device. In this manner, a bistable memory cell 100 can be obtained when an NDR-FET and an IGFET are formed on the same semiconductor substrate.

Figure 9:
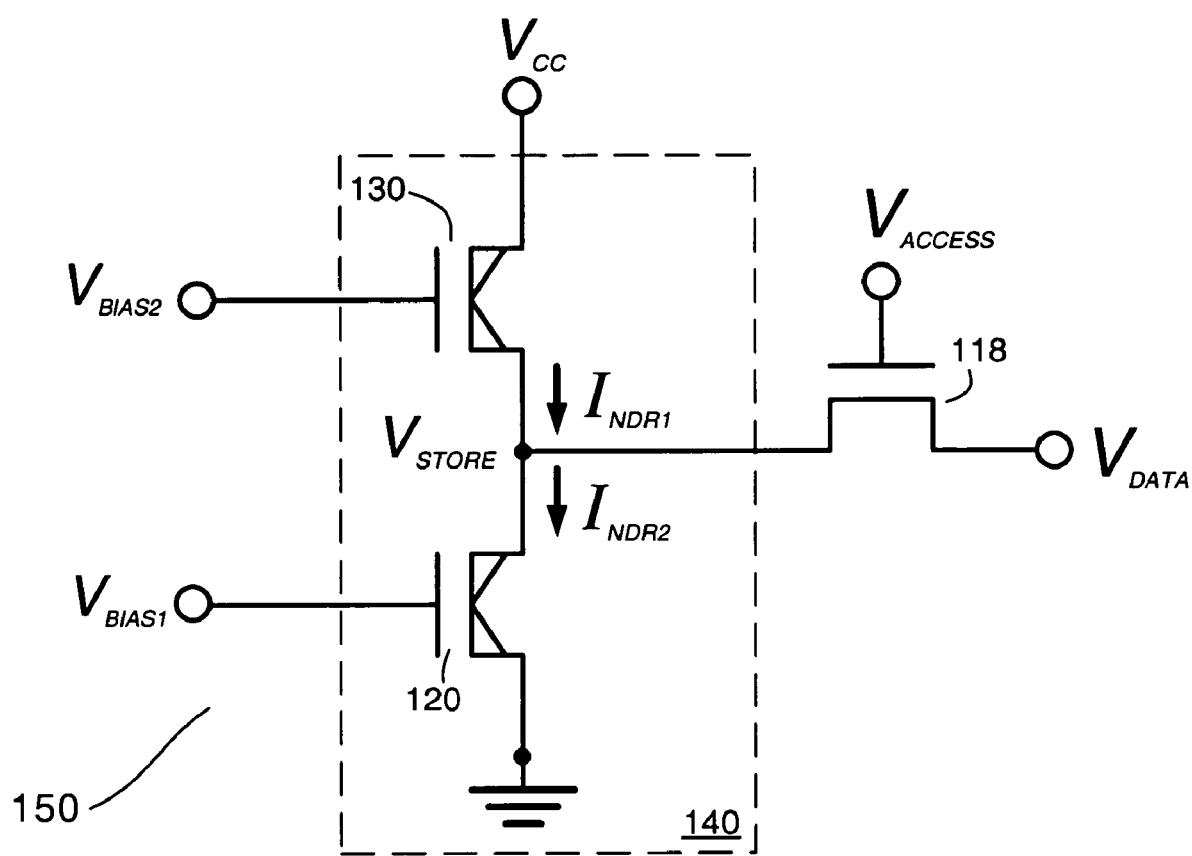
FIG. 9 is a circuit diagram of a static random access memory (SRAM) cell consisting of the combination of two NDR-FET elements which form a bistable latch and one enhancement-mode IGFET access element.
Figure 10:
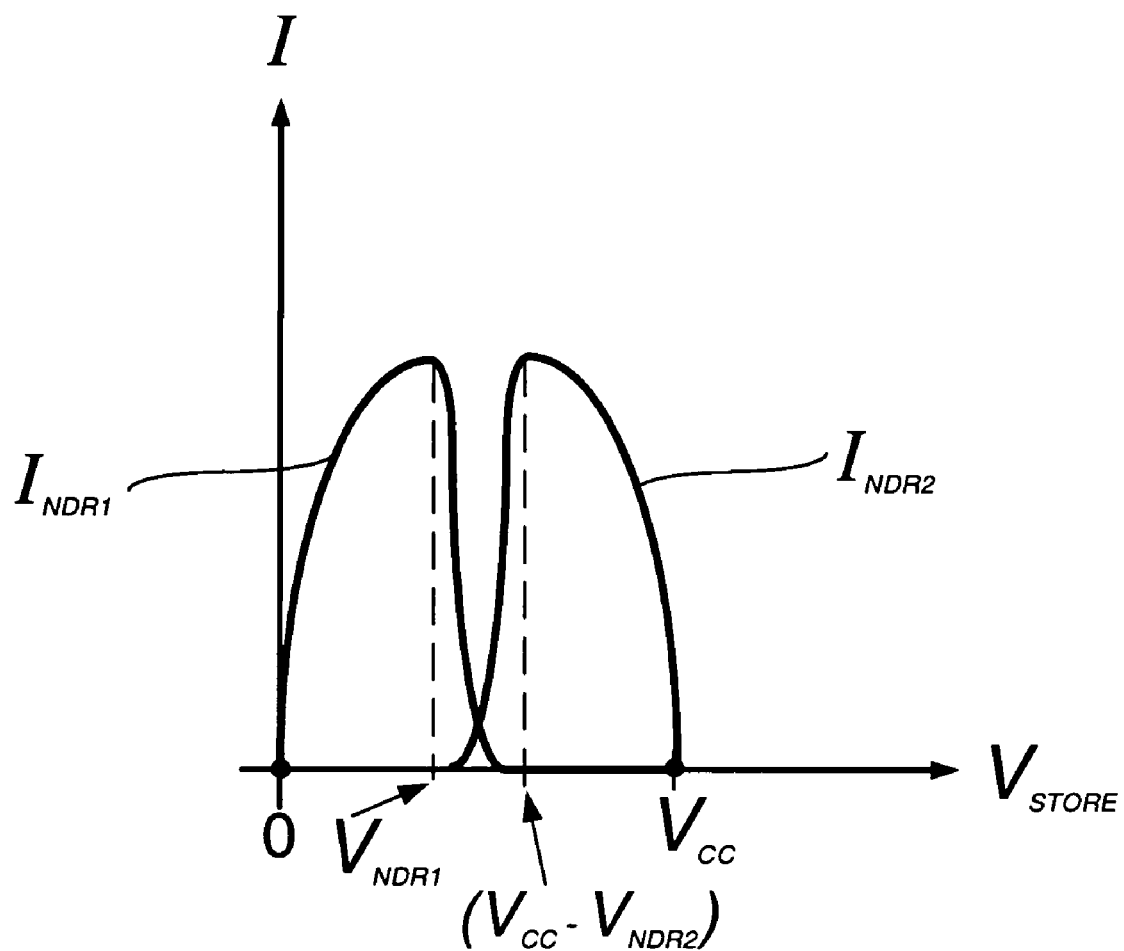
FIG. 10 is a plot of the current-vs.-voltage characteristic of the bistable latch formed by the combination of two NDR-FETs as shown in FIG. 9.

A semiconductor device according a fifth embodiment of the invention will now be described with reference to FIGS. 9 and 10. FIG. 9 is a circuit diagram of a static memory (SRAM) cell 150 consisting of two NDR-FET elements which form a bistable latch 140 and one enhancement-mode IGFET access element, and FIG. 10 is a current-vs.-voltage plot illustrating the operational characteristics of the static memory cell of FIG. 9.

As is shown in FIG. 9, an IGFET 118 is configured as a transfer gate, allowing a data node at potential $V_{data}$ to be connected to a storage node at potential $V_{store}$ under the control of an access signal $V_{access}$. One of the source/drain electrodes of IGFET 118 is connected to the storage node, the other source/drain electrode of IGFET 118 is connected to the data node, and the gate electrode of IGFET 118 is connected to an access signal terminal (read or write). The source electrode of a first NDR-FET 120 is connected to a ground terminal, the gate electrode of the first NDR-FET 120 is supplied with a first bias voltage $V_{bias1}$, the drain electrode of the first NDR-FET 120 is connected together with the source electrode of a second NDR-FET 130 to the storage node, the gate electrode of the second NDR-FET 130 is supplied with a second bias voltage $V_{bias2}$ and the drain electrode of the second NDR-FET 130 is supplied with a positive voltage $V_{cc}$. The current flowing in the first NDR-FET, $I_{NDR1}$, is dependent on the difference between its drain electrode potential and its source electrode potential, $V_{store}$, at first increasing rapidly as $V_{store}$ increases, reaching a peak value when $V_{store}$ is equal to a critical voltage $V_{NDR1}$, and rapidly decreasing to nearly zero as $V_{store}$ increases beyond the critical voltage $V_{NDR1}$. The bias voltage $V_{bias1}$ is sufficiently high so as to ensure that the first NDR-FET is turned on for values of $V_{store}$ ranging from 0 V (ground potential) to $V_{NDR1}$. The current flowing in the second NDR-FET, $I_{NDR2}$, is dependent on the difference between its drain electrode potential and its source electrode potential, $V_{cc}\text{-}V_{store}$, at first increasing rapidly as $V_{cc}\text{-}V_{store}$ increases, reaching a peak value when $V_{cc}\text{-}V_{store}$ is equal to a critical voltage $V_{NDR2}$, and rapidly decreasing to nearly zero as $V_{cc}\text{-}V_{store}$ increases beyond the critical voltage $V_{NDR2}$. The bias voltage $V_{bias2}$ is sufficiently high so as to ensure that the second NDR-FET is turned on for values of $V_{cc}\text{-}V_{store}$ ranging from 0 V (ground potential) to $V_{NDR2}$.

Now the operation of the bistable latch 140 in the SRAM cell 150 of FIG. 9 will be described. FIG. 10 shows the current-vs.-voltage (I–V) characteristic curve $I_{NDR1}$ of the first NDR-FET 120 obtained by changing the storage node voltage $V_{store}$ in a range between 0 and $V_{cc}$, superimposed with the I–V characteristic curve $I_{NDR2}$ of the second NDR-FET 130. A stable operating point of circuit 150 is a point where the I–V characteristic curve $I_{NDR1}$ of the first NDR-FET 120 crosses the I–V characteristic curve $I_{NDR2}$ of the second NDR-FET 130 and additionally the characteristic curves $I_{NDR1}$ and $I_{NDR2}$ have different gradient signs (positive, negative, or zero). (A crossing point where both of the characteristic curves $I_{NDR1}$ and $I_{NDR2}$ have positive or negative gradient is not a stable operating point.) Therefore it is understood that circuit 150 is stable when the potential $V_{store}$ at the storage node is one of two values 0 and $V_{cc}$ as shown in FIG. 10. Accordingly, circuit 150 can be used as a bistable memory cell by applying a potential of one of the two values 0 and $V_{high}$ to the control terminal as a write voltage. If the value of $V_{store}$ increases slightly above that of a stable operating point, current $I_{NDR1}$ flowing in the first NDR-FET 120 becomes higher than the current $I_{NDR2}$ flowing in the second NDR-FET 130, causing the value of $V_{store}$ to be decreased toward 0 V (ground potential), to restore it to that of the stable operating point. Thus first NDR-FET 120 serves as a "pull-down" device. If the value of $V_{store}$ falls slightly below that of a stable operating point, the current $I_{NDR2}$ flowing in the second NDR-FET 130 becomes higher than the current $I_{NDR1}$ flowing in the first NDR-FET 120, causing the value of $V_{store}$ to be increased toward $V_{cc}$, to restore it to that of the stable operating point. Thus second NDR-FET 130 serves as a "pull-up" device. IGFET 118 is controlled by the access signal as follows: when the access signal potential is sufficiently high, IGFET 118 is turned on, connecting the data node to the storage node to allow data transfer (reading data from the storage node, or writing data to the storage node); when the access signal potential is low, IGFET 118 is turned off, so that the storage node is electrically isolated from the data node. In this manner, a bistable latch 140 is realized with two series-connected NDR-FET elements, and a static memory cell 150 is obtained when two NDR-FETs and an IGFET are formed on the same semiconductor substrate.

It will be understood by those skilled in the art that the particular implementation of circuit 100 (i.e., in one of the forms noted above or some apparent variation) will likely vary from application to application. Moreover, it is likely that such circuit will be combined with other well-known circuit elements (including sense amplifiers, buffers, decoders, etc.) for purposes of creating larger memory cell arrays. Furthermore, it is expected that IGFETs and NDR FETs will be combined by skilled artisans to effectuate a number of different memory and logic circuits not shown explicitly herein, and the present invention is by no means limited to the specific examples depicted. For example, multi-valued memory cells can be synthesized through well-known techniques by using appropriate combinations of IGFETS and NDR FETs having different NDR onset behavior.

A preferred fabrication process flow for manufacturing a semiconductor device comprising one or more NDR-FETs and one or more IGFETs will now be described with reference to FIGS. 11 through 20, which are schematic cross-sectional views at various steps in the process flow.

Figure 11:
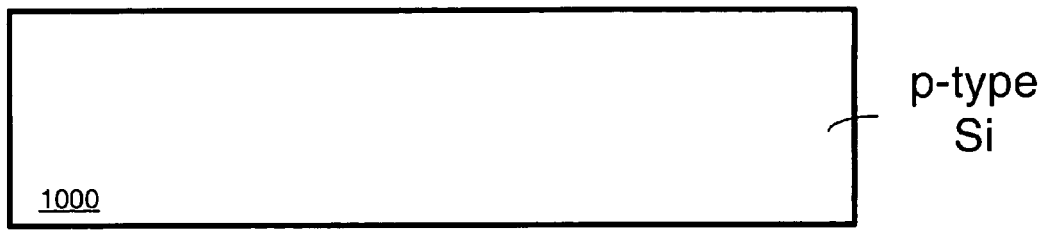
FIG. 11 is a schematic cross-sectional view of a starting substrate used to manufacture a semiconductor device comprising one or more IGFET elements and one or mote NDR-FET elements.

First, as is shown in FIG. 11, a preferred substrate 1000 consisting substantially of silicon (Si) is prepared. Because the NDR-FET and IGFET are n-channel devices, the portions of the substrate in which the NDR-FET(s) and IGFET(s) are to be formed are preferably p-type. P-type wells can be formed in the surface (within the top 1000 nm) of the substrate by ion implantation and/or diffusion, either before or after the definition of "active" areas, in any number of known techniques known to those skilled in the art. It should be noted that substrate 1000 could also be silicon-on-insulator (SOI), and may eventually contain one or more additional layers of silicon-germanium alloy material (not shown).

Figure 12:
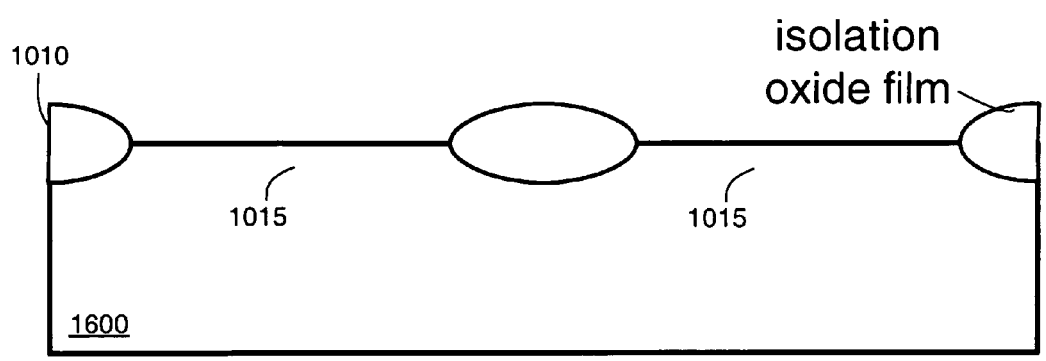
FIG. 12 is a schematic cross-sectional view showing the step of forming electrically isolated active areas in the surface region of the substrate.

Next, as is shown in FIG. 12, electrically isolated "active" areas 1015 in a surface of substrate 1000 are formed by any of several well-established techniques, including preferably by local oxidation of silicon (LOCOS) and/or shallow trench isolation (STI). The thickness of an isolation oxide layer 1010 typically falls in a range from 100 nm to 700 nm, while a depth of shallow trench isolation structures typically falls in the range from 100 nm to 1000 nm. It should be noted that the precise details of these areas are not critical to the operation of the present invention, but a significant advantage of course lies in the fact that such structures (however formed) can be share by both conventional active devices as well as the NDR devices in accordance with the present teachings.

Afterwards, ion implantation of dopants into the surface of substrate 1000 is preferably performed (either selectively with a mask or non-selectively) for the purpose of adjusting the threshold voltages of the NDR-FET(s) and IGFET(s) to their desired values. It is possible, of course, that different threshold voltages may be needed, so that additional masking and implanting operations may be needed for separate adjustments to such devices. However, as before, the details of such threshold adjust is not critical to the operation of the present invention, but yet in many instances both time and cost savings can be achieved by sharing such operational step between both conventional active devices as well as the NDR devices.

Figure 13:
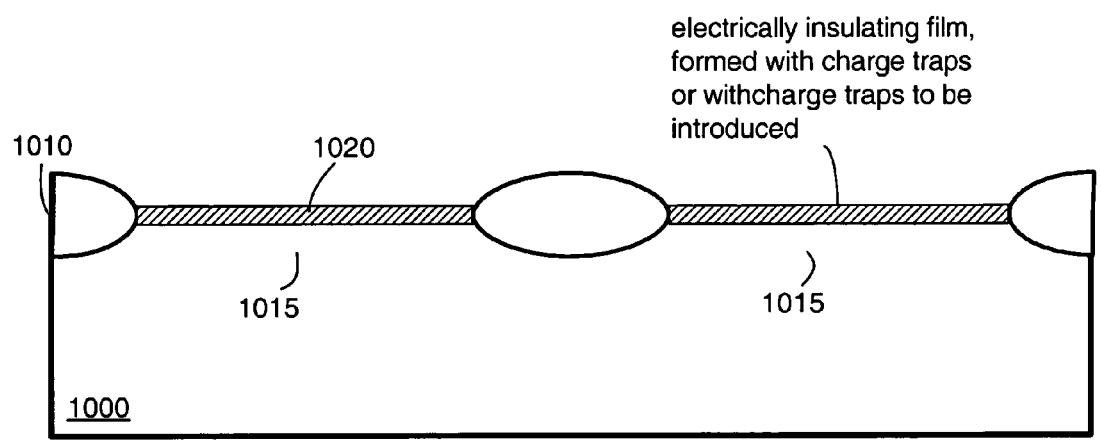
FIG. 13 is a schematic cross-sectional view showing the step of forming an initial insulating layer on the surface of the substrate in the active areas.

Next, as is shown in FIG. 13, a first electrically insulating layer 1020 is preferably formed on the surface of substrate 1000 in active areas 1015 by one of several well-known techniques, including thermal oxidation of silicon, physical vapor deposition and chemical vapor deposition. This electrically insulating layer 1020 can consist entirely or in part of $SiO_2$, $SiO_xN_y$, $Si_3N_4$, or a high-permittivity dielectric material such as metal oxide or metal silicate or their laminates. As with the other processing steps noted above, an advantage of the present invention lies in the fact that this layer can be shared later by both conventional and NDR FET devices.

If electrically insulating layer 1020 does not contain a sufficiently high density of charge traps as formed, then it is preferable to introduce charge traps at or near the silicon substrate interface. This can be accomplished by one of several known approaches, including ion implantation and/or diffusion of an appropriate species. If electrically insulating layer 1020 is very thin (e.g. less than 1.5 nm) charge traps can be formed by deposition of an additional continuous or discontinuous layer of charge-trapping material such as $SiO_xN_y$, $Si_3N_4$, Si, Ge or metal.

Two representative examples of techniques to form charge traps neat the silicon substrate interface are illustrated in FIGS. 14 and 15. Other approaches will be apparent to those skilled in the art, and the present invention is by no means limited to such examples.

Figure 14A:
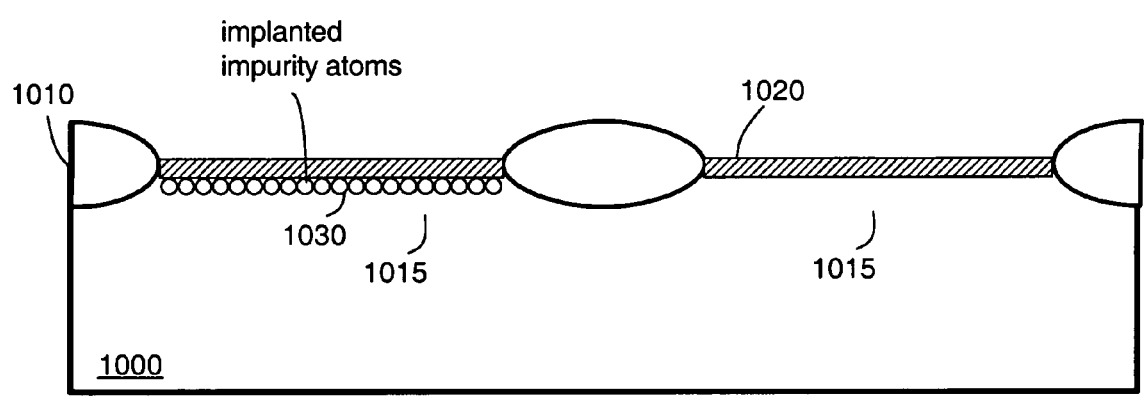
FIG. 14a is a schematic cross-sectional view showing the step of selectively introducing impurities into the surface of the substrate in the active area where the NDR-FET will reside.
Figure 14B:
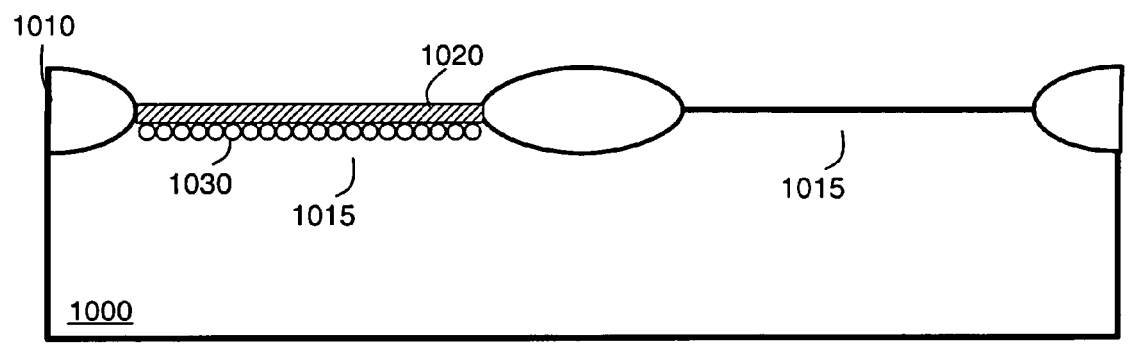
FIG. 14b is a schematic cross-sectional view showing the step of selectively removing the initial insulating layer from the active area where the IGFET will reside.

In a first approach shown in FIG. 14a, impurity atoms are selectively implanted into a surface of substrate 1000 in the areas where NDR-FETs are to be formed to form a charge trapping region 1030 near the silicon substrate interface. These impurity atoms may be dopants such as boron, indium, arsenic and phosphorus, or fluorine, chlorine, or germanium. Electrically insulating layer 1020 may then be selectively removed from the areas where IGFETs are to be formed, as is shown in FIG. 14b, if it is undesirable to have it remain in those areas. Thus, in this instance, this particular operation (creation of charge trapping layer 1030) is performed uniquely for the NDR FETs, but not for the conventional FETs.

Figure 15A:
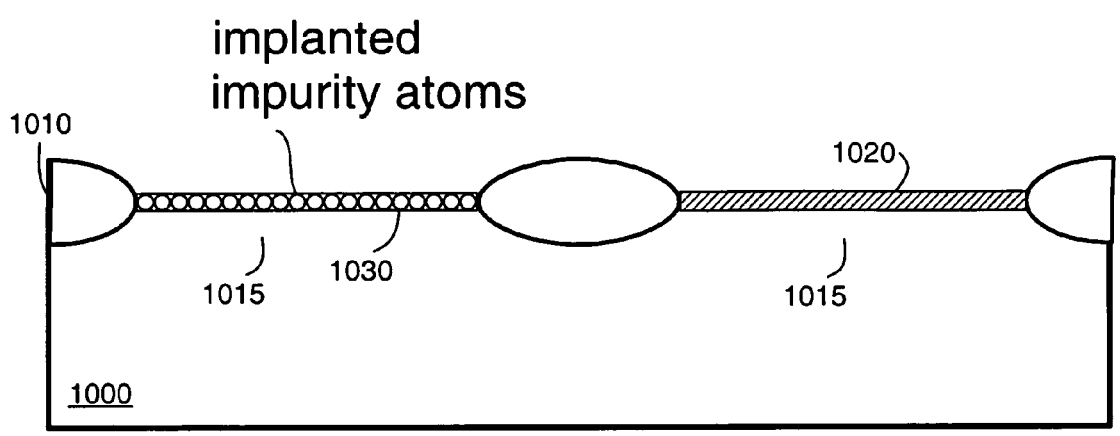
FIG. 15a is a schematic cross-sectional view showing the step of selectively introducing impurities into the initial insulating layer in the active area where the NDR-FET will reside.
Figure 15B:
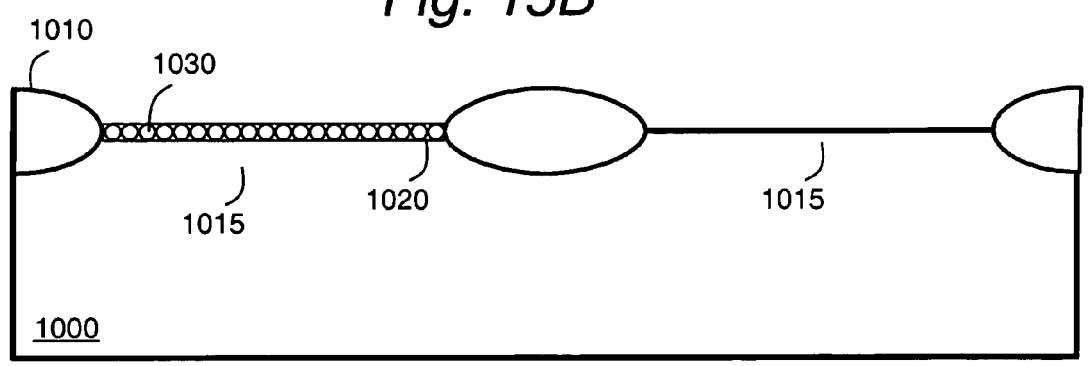
FIG. 15b is a schematic cross-sectional view showing the step of selectively removing the initial insulating layer from the active area where the IGFET will reside.

In a second approach shown in FIG. 15a, impurity atoms can be selectively implanted directly into electrically insulating layer 1020 in the areas where NDR-FETs are to be formed to form a charge trapping region within such insulating layer. These impurity atoms may be dopants such as boron, indium, arsenic and phosphorus, or fluorine, chlorine, or germanium. Again, as before, electrically insulating layer 1020 may then be selectively removed from the areas where IGFETs are to be formed, as is shown in FIG. 15b, if it is undesirable to have it remain in those areas.

Figure 16:
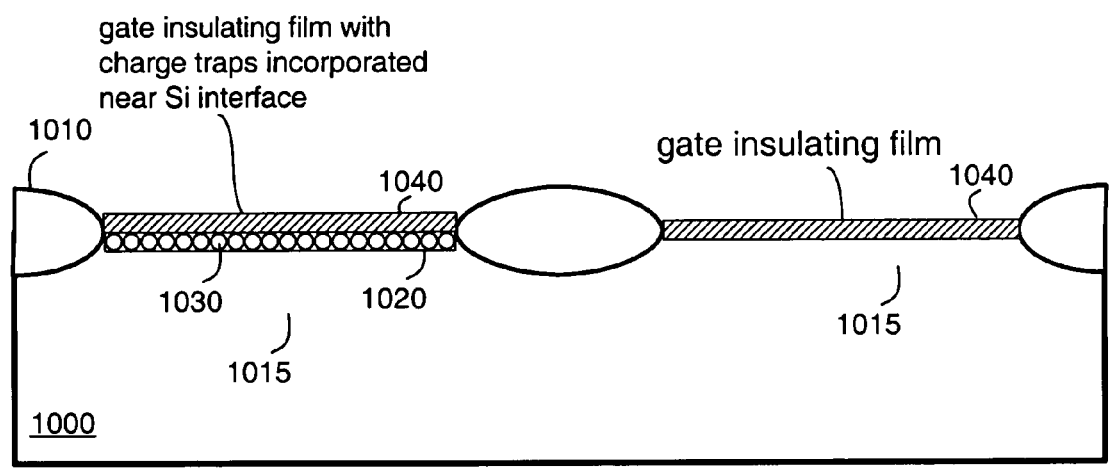
FIG. 16 is a schematic cross-sectional view showing the step of forming an additional insulating layer on the surface of the substrate in the active regions.

If electrically insulating layer 1020 is selectively removed from the areas where IGFETs are to be formed, then a high-quality gate insulating film 1040 is then preferably formed next on the surface of substrate 1000 in active areas 1015, as is shown in FIG. 16 to form a gate insulation layer for such IGFETs. Gate insulating film 1040 can be formed by one of several techniques, including thermal oxidation, physical vapor deposition and chemical vapor deposition. If the formation process for gate insulation layer 1040 uses sufficiently high temperatures, impurities present in the surface of substrate 1000 (as in FIG. 14) can be incorporated by diffusion into electrically insulating film 1020/1040 to form charge traps in such insulating film near the substrate interface (for illustrative purposes, films 1020 and 1040 are shown as a single composite gate film in FIG. 16). Gate insulating film 1040 can consist entirely or in part of $SiO_2$, $SiO_xN_y$, $Si_3N_4$, or a high-permittivity dielectric material such as metal oxide or metal silicate or their laminates.

In this manner, charge traps are selectively formed in a gate insulating film 1040 in the NDR-FET areas, either by ion implantation and/or diffusion of an appropriate species or by depositing a charge-trapping layer, either before or after part or all of the NDR-FET gate insulating film 1040 has been formed. Again, in the above process steps, features and structures of the NDR FETs are manufactured at the same time and common processing steps as those used for IGFETs in the integrated circuit.

If a "buried contact" between the gate electrode and source or drain region of the IGFET (or NDR FET) is required, then contact hole(s) are formed in gate insulating film 140 using standard lithography and etching processes. As before, such contacts can also be created at the same time for both types of FETs.

Figure 17:
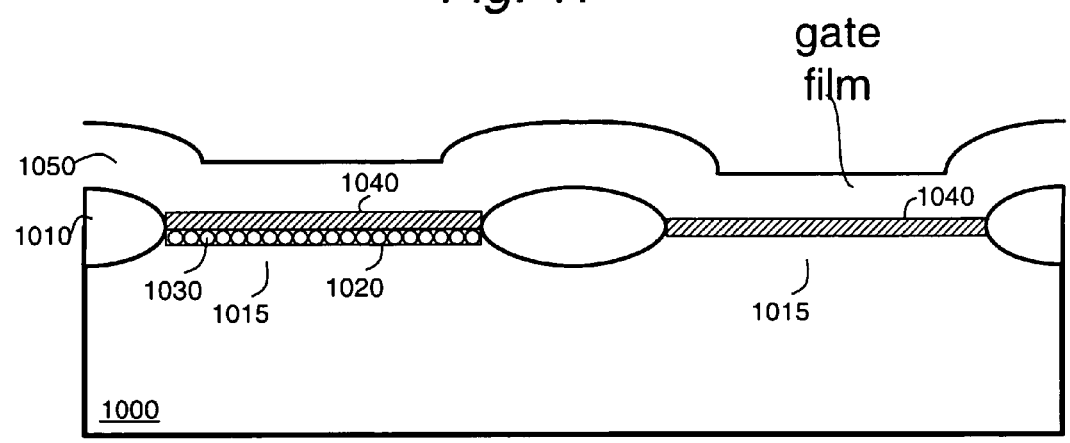
FIG. 17 is a schematic cross-sectional view showing the step of depositing a gate film.
Figure 18:
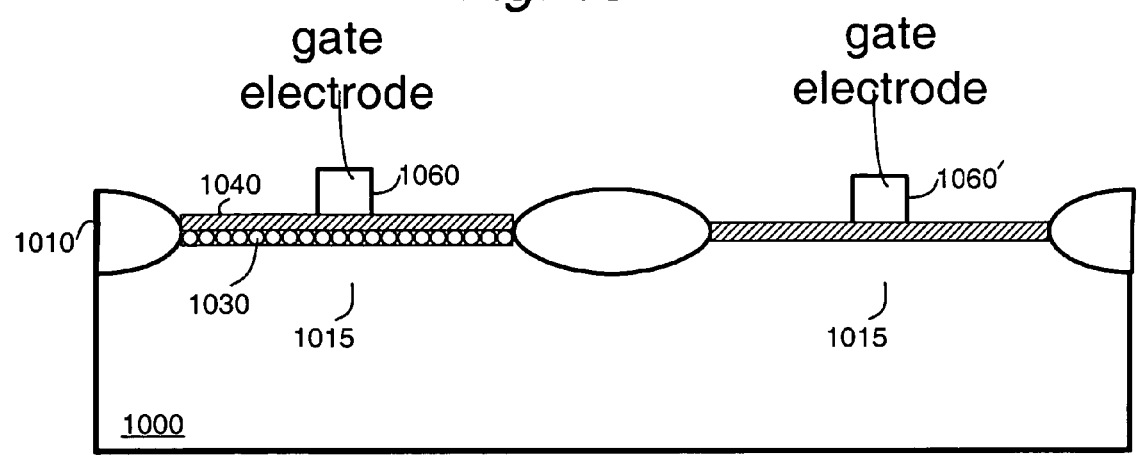
FIG. 18 is a schematic cross-sectional view showing the step of patterning the gate film into gate electrodes.

Next as shown in FIG. 17, a gate electrode film/layer 150 is deposited onto substrate 100, on top of gate insulating film 14 and patterned using standard lithography and etching processes to form gate electrodes (FIG. 18). The gate electrode material 150 may be polycrystallite silicon (poly-Si) or a silicon-germanium alloy (poly-SiGe), or it may be a metal or conductive metal nitride or conductive metal oxide. An advantage of the present invention, again, is apparent because the gates of both NDR FETs and conventional FETs can be made of the same material, and at the same time.

If gate electrode material 150 is poly-Si or poly-SiGe, it may doped in-situ during the deposition process or it may be doped ex-situ by ion implantation and/or diffusion, to achieve low resistivity and a proper work function value. Gate electrode 1060 may consist of a multi-layered stack, with a lowest layer providing a desired gate work function and overlying layer(s) providing sufficient thickness and conductivity. After gate patterning, a thermal anneal may be performed in an oxidizing ambient (e.g. $O_2$ or $H_2O$) to anneal out any damage to gate insulating film 1050 at the edges of gate electrodes 1060. If boron is to be incorporated into electrically insulating film 1040 in the NDR-FET areas of substrate 1000, it can enhance the formation of water-related traps in the electrically insulating film during an anneal in a steam ($H_2O$) ambient.

Figure 19:
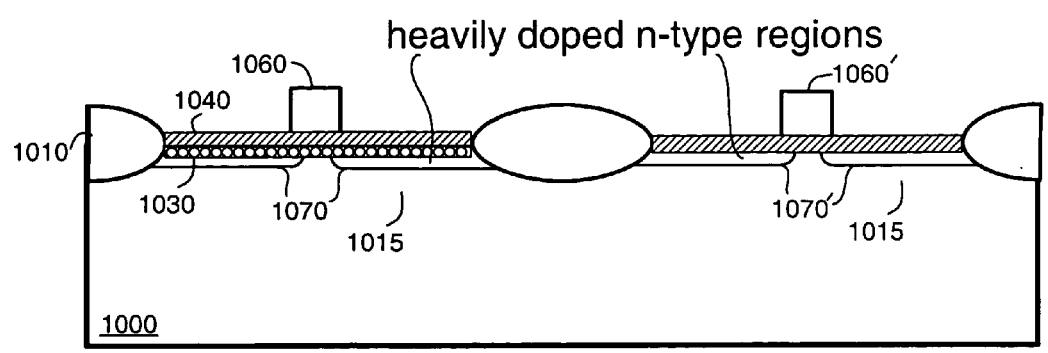
FIG. 19 is a schematic cross-sectional view showing the step of forming the source and drain electrodes for the NDR-FET and IGFET devices.

As shown in FIG. 19, source and drain contact regions (electrodes) are then formed by ion implantation of n-type dopants such as arsenic and phosphorus and subsequent thermal annealing to remove damage and to activate the dopants. In this particular implementation, gate electrodes 1060 are sufficiently thick to prevent implanted ions from entering the surface of substrate 1000 underneath the gate electrodes. If boron is incorporated into electrically insulating film 1040 in the NDR-FET areas, it can enhance the formation of water-related traps in the electrically insulating film during an anneal in a steam ($H_2O$) ambient In order to achieve good short-channel IGFET performance Low leakage current when the transistor is turned off, shallow source/drain extension regions (not shown) may be formed first by ion implantation or diffusion in the IGFET areas, either before or after deep source and drain regions. In this case, the deep source and drain regions are offset from the edges of the gate electrode by spacers formed along the sidewalls of the gate electrodes. The sidewall spacers are formed by conformal deposition and anisotropic etching of a spacer film. (The thickness of this spacer film determines the width of the sidewall spacers and hence the offset from the gate electrode.)

If the shallow source/drain extension regions are to be formed after the deep source and drain regions, then disposable sidewall spacers (e.g. composed of germanium or silicon-germanium, which can be removed selectively with respect to Si, $SiO_2$, $SiO_xN_y$, $Si_3N_4$, metal, metal nitrides and metal oxides) must be used. The dopant concentration in the shallow source/drain extension regions may be lower than the dopant concentration in the deep source and drain regions, to reduce hot-carrier effects which can cause reliability problems. Shallow source/drain extension regions may be formed in the NDR-FET areas simultaneously with the shallow source/drain extension regions in the IGFET areas. The dopant concentration and junction depth of the shallow source/drain extensions for the NDR-FET can be made to be different from those for the NDR-FET, if necessary, by selective (masked) ion implantation.

Figure 20:
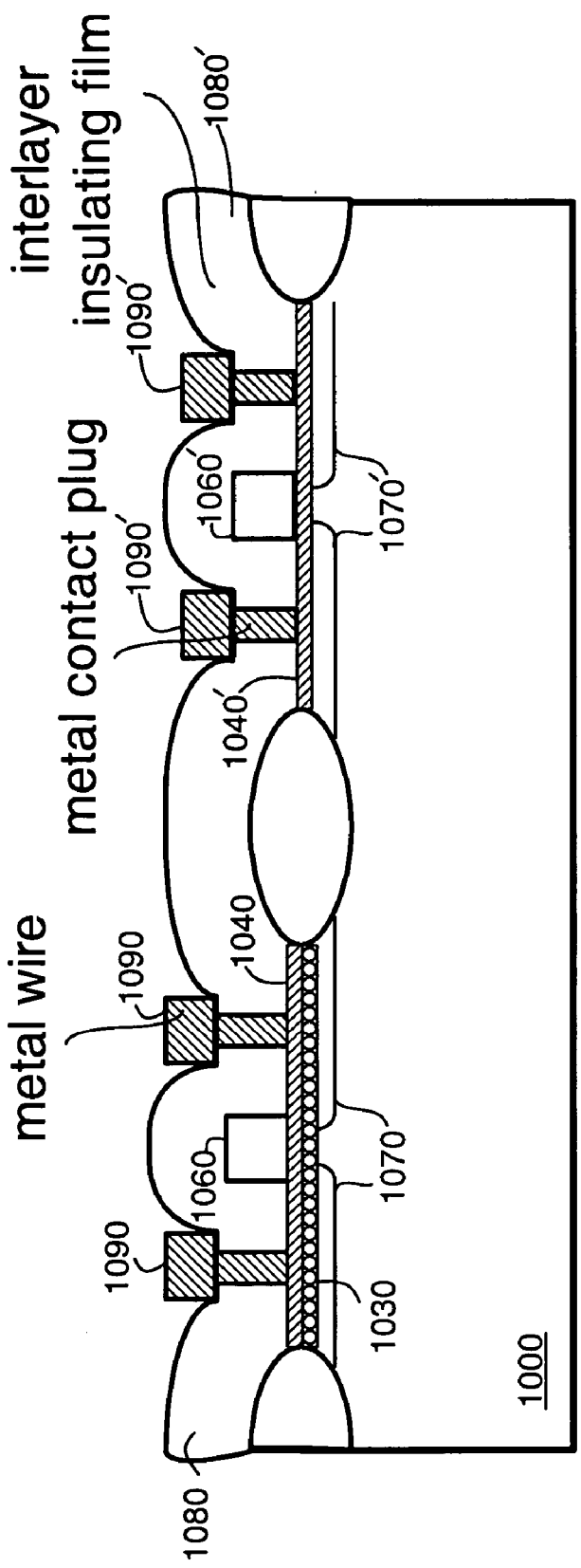
FIG. 20 is a schematic cross-sectional view showing the step of depositing an electrically insulating interlayer film, forming contact holes in the interlayer film, and depositing a metal layer and patterning the metal layer to form interconnections to the NDR-FET and IGFET devices.

As shown in FIG. 20, device fabrication is completed by deposition of an electrically insulating interlayer film 1080, formation of contact holes 1085, filling of contact holes with metal plugs 1090, deposition and patterning of a metal layer to form interconnections, and a low temperature (350° C.–450° C.) anneal in a hydrogen-containing ambient (forming gas). Multiple layers of metal wiring, if necessary, may be formed by deposition and patterning of alternate layers of insulating material and metal.

In this manner, a semiconductor device comprising one or more IGFET elements and one or more NDR-FET elements can be manufactured on a common substrate utilizing a fabrication sequence utilizing conventional processing techniques. For example, an NDR FET and a conventional IGFET share a number of common layers in their respective areas including: a common substrate 1000; gate film 1040 and 1040'; gate electrode 1060 and 1060'; interlayer insulation layer 1080 and 1080'; metal plugs/layer 1090 and 1090'. Furthermore, they also share certain isolation areas 1010, and have source/drain regions 1070 and 1070' formed at the same time with common implantation/anneal steps. In some cases, there can be direct sharing of such regions of course, so that the drain of an NDR FET can correspond to a drain/source of an IGFET, or vice versa. It will be understood that other processing steps and/or layers may be performed in addition to those shown above, and these examples are provided merely to illustrate the teachings of the present inventions. For example, additional interconnect and/or insulation layers are typically used in ICs and can also be shared.

While this invention has been described with reference to illustrative embodiments, this description is not intended to be construed in a limiting sense. It will be clearly understood by those skilled in the art that foregoing description is merely by way of example and is not a limitation on the scope of the invention, which may be utilized in many types of integrated circuits made with conventional processing technologies. Various modifications and combinations of the illustrative embodiments, as well as other embodiments of the invention, will be apparent to persons skilled in the art upon reference to the description. Such modifications and combinations, of course, may use other features that are already known in lieu of or in addition to what is disclosed herein. It is therefore intended that the appended claims encompass any such modifications or embodiments. While such claims have been formulated based on the particular embodiments described herein, it should be apparent the scope of the disclosure herein also applies to any novel and non-obvious feature (or combination thereof) disclosed explicitly or implicitly to one of skill in the art, regardless of whether such relates to the claims as provided below, and whether or not it solves and/or mitigates all of the same technical problems described above. Finally, the applicants further reserve the right to pursue new and/or additional claims directed to any such novel and non-obvious features during the prosecution of the present application (and/or any related applications).

What is claimed is:

1. A method of fabricating a semiconductor device comprising the steps of:
   (a) providing a semiconductor die;
   (b) forming insulated gate field effect transistors (IG-FETS) in and/or on said semiconductor die during a first set of operations;
   (c) forming negative differential resistance field effect transistors (NDR-FETs) in and/or on said semiconductor die during a second set of processing operations,
   wherein said first set of processing operations and said second set of processing operations include one or more common operations so that portions of some of said IGFETs and portions of at least some of said NDR FETs are formed at the same time during said one or more common operations
   wherein an IGFET gate insulation layer is formed using a different set of processing operations than those used for forming an NDR FET gate insulation layer.

2. The method of claim 1, wherein said IGFET gate insulation layer is substantially thinner than said NDR FET gate insulation layer.

3. The method of claim 1, wherein at least a part of said NDR FET gate insulation layer is formed prior to said IGFET gate insulation layer.

4. The method of claim 1, wherein said NDR FET gate insulation layer and said IGFET gate insulation layer include a common gate-dielectric layer, and said NDR FET gate insulation layer further includes an additional gate-dielectric layer.

5. The method of claim 4 further including a step of forming a charge trap layer within said additional gate-dielectric layer or at the interface between the gate insulating film and a channel of the NDR-FET.

6. The method of claim 5 further including a step of forming an additional common gate-dielectric layer over said additional gate-dielectric layer of said NDR FETs and said common gate-dielectric layer of said NDR FETs and IGFETs.

7. The method of claim 5, wherein said charge trap layer is formed by implantation in regions of said NDR FETs and/or oxidation of doped channel regions of said NDR FETs.

8. The method of claim 7, wherein said implantation uses boron, phosphorus, arsenic, fluorine, silicon, germanium, nitrogen or a metallic species.

9. A method of fabricating a semiconductor device comprising the steps of:
   (a) providing a semiconductor die;
   (b) forming insulated gate field effect transistors (IGFETs) in and/or on said semiconductor die during a first set of operations;
   (c) forming negative differential resistance field effect transistors (NDR FETs) in and/or on said semiconductor die during a second set of processing operations,
   wherein said first set of processing operations and said second set of processing operations include one or more common operations so that portions of some of said IGFETS and portions of at least some of said NDR FETs are formed at the same time during said one or more common operations,
   wherein said first set of operations include a first implant operation for an IGFET threshold adjustment, and said second set of operations include a second implant operation for an NDR FET threshold adjustment, and further wherein said first implant operation and said second implant operation are performed separately.

10. The method of claim 9, wherein said first implant operation and said second implant operation use different dopant species.

11. The method of claim 9, wherein IGFET channel regions are formed with a substantially different doping profile than NDR FET channel regions.

12. A method of fabricating a semiconductor device comprising the steps of:
   (a) providing a semiconductor die;
   (b) forming insulated gate field effect transistors (IGFETs) in and/or on said semiconductor die during a first set of operations;
   (c) forming negative differential resistance field effect transistors (NDR FETs) in and/or on said semiconductor die during a second set of processing operations,
   wherein said first set of processing operations and said second set of processing operations include one or more common operations so that portions of some of said IGFETS and portions of at least some of said NDR FETs are formed at the same time during said one or more common operations,
   wherein said second set of operations include a step of forming a charge trap layer for said NDR FETs within a gate insulating film or at the interface between said gate insulating film and a semiconductor channel of the NDR-FETs.

* * * * *